United States Patent
Yamazaki et al.

US012672481B2

(12) United States Patent

(10) Patent No.: US 12,672,481 B2

(45) Date of Patent: Jun. 30, 2026

(54) DISPLAY DEVICE INCLUDING A GAP BETWEEN LIGHT-EMITTING ELEMENTS, METHOD FOR MANUFACTURING THE DISPLAY DEVICE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Yasuhiro Jinbo, Isehara (JP); Yuichi Yanagisawa, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 368 days.

(21) Appl. No.: 18/270,945

(22) PCT Filed: Dec. 27, 2021

(86) PCT No.: PCT/IB2021/062319

§ 371 (c)(1),
(2) Date: Jul. 5, 2023

(87) PCT Pub. No.: WO2022/149040

PCT Pub. Date: Jul. 14, 2022

(65) Prior Publication Data

US 2024/0065036 A1 Feb. 22, 2024

(30) Foreign Application Priority Data

Jan. 8, 2021 (JP) ................................ 2021-001852

(51) Int. Cl.

*H10K 85/60* (2023.01)
*H10K 50/17* (2023.01)

(Continued)

(52) U.S. Cl.

CPC ......... *H10K 85/626* (2023.02); *H10K 50/171* (2023.02); *H10K 59/1201* (2023.02);

(Continued)

(58) Field of Classification Search

CPC ............... H10K 85/626; H10K 50/171; H10K 59/1201; H10K 59/122; H10K 85/6572;

(Continued)

(56) References Cited

U.S. PATENT DOCUMENTS 5,537,000 A * 7/1996 Alivisatos ............. B82Y 30/00 313/499
5,953,985 A 9/1999 Kobayashi (Continued)

FOREIGN PATENT DOCUMENTS

CN 102687591 A 9/2012
CN 105393642 A 3/2016

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Caleb E Henry
(74) *Attorney, Agent, or Firm* — Husch Blackwell LLP

(57) ABSTRACT

A display device capable of high-quality images can be provided. The display device includes a first light-emitting element, a second light-emitting element, and a gap. The first light-emitting element includes a first light-emitting layer and a first electron-injection layer over the first light-emitting layer, and the second light-emitting element includes a second light-emitting layer and a second electron-injection layer over the second light-emitting layer. The first light-emitting element is adjacent to the second light-emit- (Continued)

ting element. The gap is placed between the first electron-injection layer and first light-emitting layer and the second electron-injection layer and second light-emitting layer. The first electron-injection layer comprises a region projecting from the side surface of the first light-emitting layer, and the second electron-injection layer comprises a region projecting from the side surface of the second light-emitting layer.

22 Claims, 20 Drawing Sheets

(51) Int. Cl.
*H10K 59/12* (2023.01)
*H10K 59/122* (2023.01)
*H10K 59/80* (2023.01)

(52) U.S. Cl.
CPC ....... *H10K 59/122* (2023.02); *H10K 85/6572* (2023.02); *H10K 59/873* (2023.02); *H10K 59/879* (2023.02)

(58) Field of Classification Search
CPC ............... H10K 59/873; H10K 59/879; H10K 59/123; H10K 50/115; H10K 59/35; H10K 71/00; H10K 85/111; H10K 50/18; H10K 71/233; H10K 59/38; G09F 9/00; G09F 9/30; H05B 33/02; H05B 33/10; H05B 33/12; H05B 33/22; G03F 7/038; G03F 7/039; G03F 7/004; H01L 33/504; H01L 25/0753; H01L 33/58; H01L 33/54; H01L 2933/0091; H01L 33/56; H01L 33/50
See application file for complete search history.

(56) References Cited

U.S. PATENT DOCUMENTS 6,120,338 A 9/2000 Hirano et al.
7,651,674 B2 * 1/2010 Jun ...................... C09K 11/565 977/773
7,910,400 B2 * 3/2011 Kwon .................. H10K 50/115 257/E21.007
8,773,015 B2 7/2014 Yamamoto et al.
9,768,404 B1 * 9/2017 Steckel ................ H10D 86/423
9,812,004 B1 * 11/2017 Boshernitzan ......... G08C 17/02
9,831,706 B2 * 11/2017 MacWilliams ........... H02J 7/32
9,874,693 B2 * 1/2018 Baiocco ............. G02B 6/12004
10,020,448 B2 7/2018 Ando et al.
10,394,378 B2 * 8/2019 Huang .................. G06F 3/0412
10,727,287 B2 * 7/2020 Takagi ................. H10K 59/127
10,770,658 B2 9/2020 Ando et al.
10,826,011 B1 * 11/2020 Angioni ............... H10K 59/122
11,302,757 B2 4/2022 Shim et al.
11,532,680 B2 12/2022 Takagi
2002/0072139 A1 6/2002 Kashiwabara
2006/0039850 A1 * 2/2006 Jun ........................ C09K 11/08 423/561.1
2010/0140586 A1 * 6/2010 Char ...................... C01G 11/00 257/14
2011/0148290 A1 6/2011 Oota
2012/0256204 A1 10/2012 Yoshizumi et al.
2012/0273804 A1 11/2012 Hatano
2012/0276484 A1 11/2012 Izumi et al.
2012/0280345 A1 * 11/2012 Zhu ...................... G02B 6/1226 257/E31.127
2012/0306357 A1 12/2012 Yamamoto et al.
2013/0009131 A1 * 1/2013 Kazlas ................. H10K 50/171 257/13
2013/0037778 A1 * 2/2013 Kazlas ................... H10H 20/01 257/E29.024
2013/0084531 A1 4/2013 Hamaguchi et al.
2013/0084664 A1 4/2013 Yoshitoku et al.
2013/0084666 A1 4/2013 Oshige
2013/0280839 A1 10/2013 Sonoda et al.
2013/0295705 A1 11/2013 Sonoda et al.
2014/0004640 A1 1/2014 Hamaguchi et al.
2014/0004642 A1 1/2014 Otsuka et al.
2014/0027816 A1 * 1/2014 Cea ...................... H10D 62/822 257/E29.085
2014/0197507 A1 * 7/2014 Assefa .................. H10F 39/807 438/69
2014/0361260 A1 * 12/2014 Kim ..................... H10K 59/122 438/23
2015/0060826 A1 3/2015 Matsumoto et al.
2015/0069360 A1 3/2015 Sato
2015/0076476 A1 3/2015 Odaka et al.
2015/0091093 A1 * 4/2015 Bouche ................ H10D 64/251 257/369
2015/0268417 A1 * 9/2015 Assefa ................. G02B 6/4257 385/14
2016/0027848 A1 * 1/2016 Liu ........................ H10D 86/60 257/40
2016/0172595 A1 6/2016 Malinowski et al.
2016/0181532 A1 6/2016 Ando et al.
2016/0240590 A1 * 8/2016 Liu ........................ H10K 50/16
2016/0248029 A1 * 8/2016 Liu ........................ C09K 11/59
2016/0315133 A1 10/2016 Sato
2017/0062528 A1 3/2017 Aoyama et al.
2017/0115823 A1 * 4/2017 Huang .................. G06F 3/0421
2017/0141167 A1 5/2017 Naganuma
2017/0221969 A1 * 8/2017 Steckel .................. H10K 59/32
2017/0256754 A1 9/2017 Defranco et al.
2018/0019371 A1 * 1/2018 Steckel ................ C09K 11/883
2018/0180951 A1 6/2018 Toyotaka
2018/0190908 A1 7/2018 Ke et al.
2018/0254421 A1 * 9/2018 Kinge .................... H10K 50/15
2018/0309060 A1 10/2018 Ando et al.
2018/0309078 A1 * 10/2018 Ju .......................... H10K 50/15
2018/0351125 A1 * 12/2018 He ......................... H10K 71/12
2018/0366672 A1 * 12/2018 Wang ..................... H10K 71/15
2019/0051849 A1 * 2/2019 Zhou .................... H10K 50/115
2019/0148470 A1 5/2019 Takagi
2019/0157595 A1 * 5/2019 Seo ........................ H10K 50/17
2019/0296264 A1 * 9/2019 Mathai ................... H10K 50/15
2019/0334088 A1 10/2019 Ando et al.
2020/0057330 A1 2/2020 Yamazaki et al.
2020/0144342 A1 5/2020 Shim et al.
2020/0185462 A1 * 6/2020 Lee ...................... H10K 59/352
2020/0203650 A1 * 6/2020 Kim ....................... H10K 50/16
2020/0203662 A1 6/2020 Mollard et al.
2020/0321416 A1 10/2020 Takagi
2020/0388779 A1 * 12/2020 Ohsawa ............. H10K 85/6572
2021/0028385 A1 * 1/2021 Sakakibara ............ H05B 33/10
2021/0043864 A1 * 2/2021 Li ........................ H10K 50/171
2021/0151629 A1 * 5/2021 Boardman ........... H10H 20/813
2021/0408416 A1 * 12/2021 Angioni ................. H10K 50/15
2021/0408417 A1 * 12/2021 Angioni ................. H10K 50/15
2022/0013744 A1 * 1/2022 Sakakibara .......... H10K 50/115
2022/0098479 A1 * 3/2022 Mei ........................ C09K 11/55
2022/0130918 A1 4/2022 Yamazaki et al.
2022/0209162 A1 6/2022 Seo et al.
2022/0223671 A1 7/2022 Yamazaki et al.
2022/0238836 A1 7/2022 Okazaki et al.
2022/0285629 A1 9/2022 Yoshiyasu et al.
2022/0320184 A1 10/2022 Okazaki et al.
2022/0336755 A1 * 10/2022 Yoshiyasu .......... H10K 85/6572
2023/0009750 A1 * 1/2023 Yamazaki ............ H10K 59/122
2023/0016797 A1 * 1/2023 Furuta .................. H10K 71/164
2023/0025460 A1 * 1/2023 Yoshiyasu ........... C07F 15/0093
2023/0116067 A1 4/2023 Sugisawa et al.

FOREIGN PATENT DOCUMENTS

CN 111146244 A 5/2020
EP 2 501 207 A1 9/2012
JP 2000-036385 A 2/2000
JP 2003-059663 A 2/2003
JP 2006-332019 A 12/2006
JP 2008-098106 A 4/2008

(56) References Cited

FOREIGN PATENT DOCUMENTS

| | | | |
|---|---|---|---|
| JP | 2008-147072 | A | 6/2008 |
| JP | 2008-251270 | A | 10/2008 |
| JP | 2011-103194 | A | 5/2011 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-072084 | A | 5/2020 |
| JP | 2020-160305 | A | 10/2020 |
| KR | 2012-0101058 | A | 9/2012 |
| KR | 2014-0143629 | A | 12/2014 |
| KR | 2016-0011666 | A | 2/2016 |
| KR | 2019-0015207 | A | 2/2019 |
| KR | 2020-0050547 | A | 5/2020 |
| TW | 201129237 | | 8/2011 |
| TW | 201515304 | | 4/2015 |
| WO | WO 2011/058957 | A1 | 5/2011 |
| WO | WO 2015/041053 | A1 | 3/2015 |
| WO | WO 2017/212797 | A1 | 12/2017 |
| WO | WO 2018/087625 | A1 | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2021/062319) Dated Mar. 22, 2022.

Written Opinion (Application No. PCT/IB2021/062319) Dated Mar. 22, 2022.

* cited by examiner

13 — 
11          17  15

13 — 
33RA     11  21A  31A          17  15

140A

13 — 
33RA     11  21A  31A          17  15

140

13 — 
31  33R     11  21A          17  15

140          140B

13 — 
31  33R     11  21A     31B  33GA          17  15

13 —

33R 35A 11 21A     33G     31   33B   17 15

13 —

33R 35 11 21A     33G     31   33B   17 15

13 —

33R 35 11 21     33G     31   33B   17 15

13 —

33R 35 11 63   21 33G     31 33B   17 15

40 —
13 —

20R 33R 35 11    21   33G 25   31 33B   17 15

63     20G     20B

13

33A    11  21A  31A         35A              17  15

13

35  11  21              33         31        17  15

45
43

40

13

35  11        21  33  25    31         17  15

63       20

49
51
53

55R              55G              55B

20

25

30 {

35

33

31

21

20

25

30 {

35

33c

33b

33a

31

21

20

25

30b {

35

33e

31

37

30a {

35

33d

31

21

FIG. 18A
Intermediate state
New crystalline phase
| Amorphous | Crystalline | Crystal |
| --- | --- | --- |
| ・completely amorphous | ・CAAC<br>・nc<br>・CAC<br><br>excluding single crystal and poly crystal | ・single crystal<br>・poly crystal |
FIG. 18B
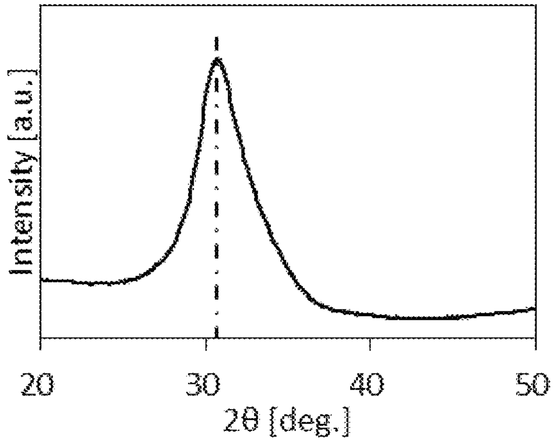
FIG. 18C
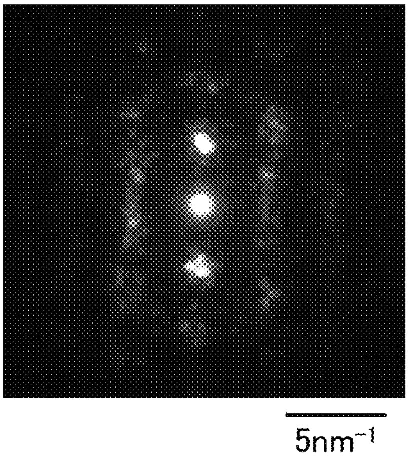

DISPLAY DEVICE INCLUDING A GAP BETWEEN LIGHT-EMITTING ELEMENTS, METHOD FOR MANUFACTURING THE DISPLAY DEVICE, AND ELECTRONIC DEVICE

This application is a 371 of international application PCT/IB2021/062319 filed on Dec. 27, 2021, which is incorporated herein by reference.

TECHNICAL FIELD

One embodiment of the present invention relates to a display device and a method for manufacturing the display device. One embodiment of the present invention relates to an electronic device.

Note that one embodiment of the present invention is not limited to the above technical field. The technical field of one embodiment of the invention disclosed in this specification and the like relates to an object, a method, or a method for manufacturing. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting apparatus, a power storage device, a memory device, driving methods thereof, or methods for manufacturing them.

BACKGROUND ART

In recent years, display devices have been expected to be applied to a variety of uses. Examples of uses for a large display device include a television device for home use (also referred to as a TV or a television receiver), digital signage, and a PID (Public Information Display). In addition, a smartphone, a tablet terminal, and the like including a touch panel are being developed as portable information terminals.

Furthermore, higher resolution of display devices have been required. For example, devices for virtual reality (VR), augmented reality (AR), substitutional reality (SR), or mixed reality (MR) are given as devices requiring high-resolution display devices and have been actively developed.

Light-emitting apparatuses including light-emitting elements (also referred to as light-emitting devices) have been developed as display devices, for example. In particular, light-emitting elements (also referred to as EL elements or EL devices) utilizing an electroluminescence (hereinafter referred to as EL) phenomenon have features such as ease of reduction in thickness and weight, high-speed response to an input signal, and driving with a direct-constant voltage source, and have been used in display devices.

Patent Document 1 discloses a display device for VR using organic EL elements (also referred to as organic EL devices).

REFERENCE

Patent Document

[Patent Document 1] International Publication No. WO2018/087625

SUMMARY OF THE INVENTION

Problems to be Solved by the Invention

An object of one embodiment of the present invention is to provide a display device that displays a high-quality image. Another object of one embodiment of the present invention is to provide a display device with high light extraction efficiency. Another object of one embodiment of the present invention is to provide a display device with a high aperture ratio. Another object of one embodiment of the present invention is to provide a high-resolution display device. Another object of one embodiment of the present invention is to provide an inexpensive display device. Another object of one embodiment of the present invention is to provide a highly reliable display device. Another object of one embodiment of the present invention is to provide a novel display device.

Another object of one embodiment of the present invention is to provide a method for manufacturing a display device that displays high-quality images. Another object of one embodiment of the present invention is to provide a method for manufacturing a display device with high light extraction efficiency. Another object of one embodiment of the present invention is to provide a method for manufacturing a display device with a high aperture ratio. Another object of one embodiment of the present invention is to provide a method for manufacturing a high-resolution display device. Another object of one embodiment of the present invention is to provide a method for manufacturing a display device with a simple process. Another object of one embodiment of the present invention is to provide a method for manufacturing a highly reliable display device. Another object of one embodiment of the present invention is to provide a method for manufacturing a novel display device.

Note that the description of these objects does not preclude the existence of other objects. Note that one embodiment of the present invention does not have to achieve all the objects. Note that other objects will be apparent from the description of the specification, the drawings, the claims, and the like, and other objects can be derived from the description of the specification, the drawings, the claims, and the like.

Means for Solving the Problems

One embodiment of the present invention is a display device including a first light-emitting element, a second light-emitting element, and a gap. The first light-emitting element includes a first light-emitting layer and a first electron-injection layer over the first light-emitting layer, the second light-emitting element includes a second light-emitting layer and a second electron-injection layer over the second light-emitting layer, the first light-emitting element is adjacent to the second light-emitting element, the gap is placed between the first electron-injection layer and first light-emitting layer and the second electron-injection layer and second light-emitting layer, the first electron-injection layer includes a region projecting from a side surface of the first light-emitting layer, and the second electron-injection layer includes a region projecting from a side surface of the second light-emitting layer.

Alternatively, the display device with the above embodiment may include a region in which a distance between a side surface of the first electron-injection layer and a side surface of the second electron-injection layer is less than or equal to 1 μm.

Alternatively, the display device with the above embodiment may include a region in which a distance between the side surface of the first electron-injection layer and the side surface of the second electron-injection layer is less than or equal to 100 nm.

Alternatively, in the above embodiment, the gap may include one or more of nitrogen, oxygen, carbon dioxide, and a Group 18 element.

Alternatively, in the above embodiment, the Group 18 element may include one or more of helium, neon, argon, xenon, and krypton.

Alternatively, in the above embodiment, a refractive index of the first light-emitting layer and a refractive index of the second light-emitting layer may be higher than a refractive index of the gap.

Alternatively, in the above embodiment, the first electron-injection layer and the second electron-injection layer may include silver and a compound having at least one of a pyridine ring, a diazine ring (a pyrimidine ring, a pyrazine ring, or a pyridazine ring), and a triazine ring.

Alternatively, in the above embodiment, the first electron-injection layer and the second electron-injection layer may include NBPhen and silver.

Alternatively, in the above embodiment, the first light-emitting element and the second light-emitting element may be provided over an insulating layer, a top surface of the insulating layer may include a region in contact with a bottom surface of the gap, and a thickness of the insulating layer in the region in which the top surface of the insulating layer may be in contact with the bottom surface of the gap may be smaller than a thickness of the insulating layer in a region overlapping with the first light-emitting layer and a thickness of the insulating layer in a region overlapping with the second light-emitting layer.

Alternatively, in the above embodiment, the display device may include a first transistor and a second transistor, the first light-emitting element may include a first electrode under the first light-emitting layer, the second light-emitting element may include a second electrode under the second light-emitting layer, one of a source and a drain of the first transistor may be electrically connected to the first electrode, one of a source and a drain of the second transistor may be electrically connected to the second electrode, and each of the first transistor and the second transistor may include silicon in a channel formation region.

An electronic device including the display device of one embodiment of the present invention and a lens is also one embodiment of the present invention.

Another embodiment of the present invention is a method for manufacturing a display device, including: depositing a layer to be a first light-emitting layer and a layer to be a first sacrifice layer and processing the layers by first etching to form the first light-emitting layer and the first sacrifice layer; depositing a layer to be a second light-emitting layer and a layer to be a second sacrifice layer and processing the layers by second etching to form the second light-emitting layer and the second sacrifice layer; removing the first sacrifice layer and the second sacrifice layer; depositing layer to be a first electron-injection layer and a second electron-injection layer and processing the layers by third etching to form the first electron-injection layer and the second electron-injection layer; and processing the first light-emitting layer and the second light-emitting layer by fourth etching so that the first electron-injection layer can include a region projecting from a side surface of the first light-emitting layer and the second electron-injection layer can include a region projecting from a side surface of the second light-emitting layer.

Alternatively, in the above embodiment, isotropy of the fourth etching may be higher than isotropy of the first to the third etching.

Alternatively, in the above embodiment, the first light-emitting layer and the second light-emitting layer may have functions of emitting light of different colors.

Effect of the Invention

One embodiment of the present invention can provide a display device that displays a high-quality image. Another embodiment of the present invention can provide a display device with high light extraction efficiency. Another embodiment of the present invention can provide a display device with a high aperture ratio. Another embodiment of the present invention can provide a high-resolution display device. Another embodiment of the present invention can provide an inexpensive display device. Another embodiment of the present invention can provide a highly reliable display device. Another embodiment of the present invention can provide a novel display device.

Another embodiment of the present invention can provide a method for manufacturing a display device that displays high-quality images. Another embodiment of the present invention can provide a method form manufacturing a display device with high light extraction efficiency. Another embodiment of the present invention can provide a method for manufacturing a display device with a high aperture ratio. Another embodiment of the present invention can provide a method for manufacturing a high-resolution display device. Another embodiment of the present invention can provide a method for manufacturing a display device with a simple process. Another embodiment of the present invention can provide a method for manufacturing a highly reliable display device. Another embodiment of the present invention can provide a method for manufacturing a novel display device.

Note that the description of these effects does not preclude the existence of other effects. One embodiment of the present invention does not have to have all these effects. Note that other effects will be apparent from and can be derived from the description of the specification, the drawings, the claims, and the like.

BRIEF DESCRIPTION OF THE DRAWINGS

FIG. 18A is a diagram showing the classification of crystal structures of IGZO. FIG. 18B is a graph showing an XRD spectrum of a CAAC-IGZO film. FIG. 18C is an image showing a nanobeam electron diffraction pattern of the CAAC-IGZO film.

MODE FOR CARRYING OUT THE INVENTION

Figure 1:
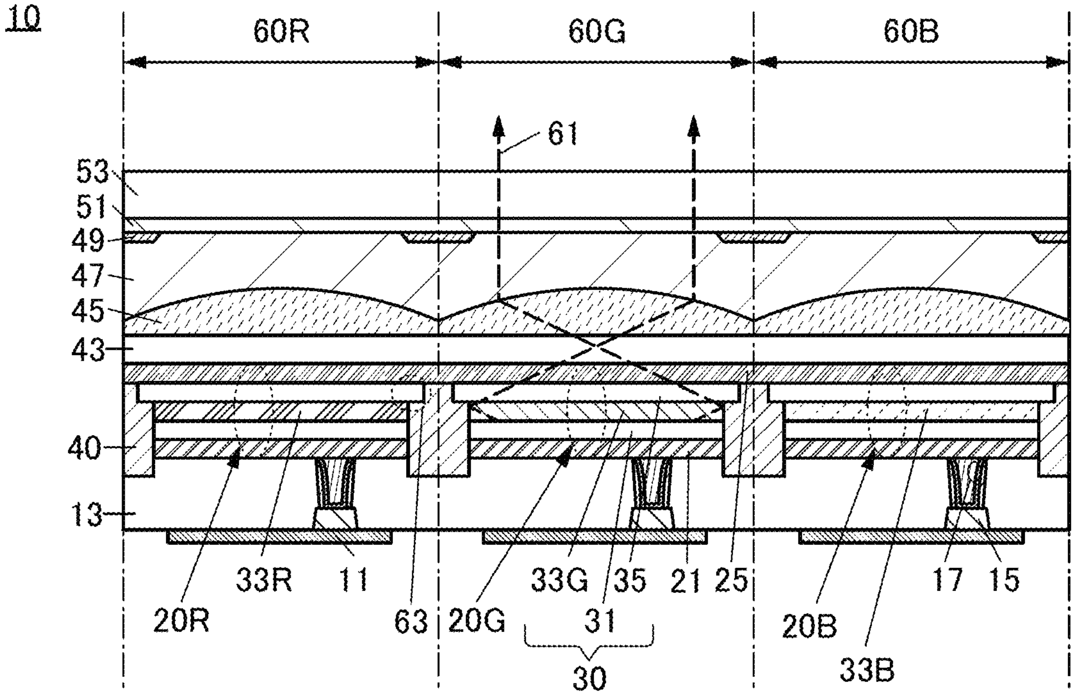
FIG. 1 is a cross-sectional view illustrating a structure example of a display device.

In this specification and the like, a semiconductor device refers to a device that utilizes semiconductor characteristics, and means a circuit including a semiconductor element (e.g., a transistor, a diode, and a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting apparatus, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow an electrical connection between X and Y (e.g., a switch, a transistor, a capacitor, an inductor, a resistor, a diode, a display element, a light-emitting element, a load, or the like) can be connected between X and Y. Note that a switch has a function of being controlled to be in an on state or an off state. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification and the like includes, in its category, such a case where one conductive film has functions of a plurality of components.

In this specification and the like, a "node" can be referred to as a terminal, a wiring, an electrode, a conductive layer, a conductor, an impurity region, or the like depending on the circuit configuration, the device structure, or the like. Furthermore, a terminal, a wiring, or the like can be referred to as "node."

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and for example, a potential supplied to a wiring, a potential applied to a circuit and the like, a potential output from a circuit and the like also change with a change of the reference potential.

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments, the scope of claims, or the like. As another example, a "first" component in one embodiment in this specification and the like can be omitted in other embodiments, the scope of claims, or the like.

In this specification and the like, the terms for describing positioning, such as "over" "under", "above" and "below" are sometimes used for convenience to describe the positional relationship between components with reference to drawings. The positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

In addition, in this specification and the like, the terms "film," "layer," and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms such as "electrode", "wiring", and "terminal" do not limit the functions of such components. For example, an "electrode" is used as part of a wiring in some cases, and vice versa. Furthermore, the terms "electrode" or "wiring" can also include the case where a plurality of "electrodes" or "wirings" are formed in an integrated manner. For example, a "terminal" is used as part of a "wiring" or an "electrode" in some cases, and vice versa. Furthermore, the term "terminal" can also mean the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms such as "electrode", "wiring", and "terminal" are sometimes replaced with the term "region" depending on the case, for example.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an "OS transistor" is described, the OS transistor can also be referred to as a transistor including a metal oxide or an oxide semiconductor.

In this specification and the like, a metal oxide containing nitrogen is also collectively referred to as a metal oxide in some cases. Furthermore, a metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

In this specification and the like, "gap" means a region containing a gas.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. Moreover, some components are omitted in a perspective view, a top view, or the like for easy understanding of the diagrams in some cases.

In the drawings in this specification, the size, the layer thickness, or the region is exaggerated for clarity in some cases. Therefore, embodiments of the present invention are not limited to the size, aspect ratio, and the like shown in the drawings. Note that the drawings are schematic views illustrating ideal examples, and embodiments of the present invention are not limited to shapes or values shown in the drawings. For example, variation in signal, voltage, or current due to noise, variation in signal, voltage, or current due to difference in timing, or the like can be included.

Embodiment 1

In this embodiment, a display device of one embodiment of the present invention and a method for manufacturing the display device will be described with reference to drawings.

One embodiment of the present invention relates to a display device in which pixels each including a light-emitting element such as an organic EL element are arranged in a matrix. In the display device of one embodiment of the present invention, the light-emitting elements provided in adjacent pixels are isolated by a gap containing a gas such as air. Light emitted in the oblique direction from the light-emitting element can be totally reflected by the gap. This can inhibit light emitted from the light-emitting element from entering an adjacent pixel.

In this specification and the like, light-emitting elements provided in adjacent pixels are referred to as adjacent light-emitting elements. The same applies to other components provided in the pixel.

In the display device of one embodiment of the present invention, the light-emitting element includes a light-emitting layer and an electron-injection layer over the light-emitting layer, and the electron-injection layer includes a region projecting from the side surface of the light-emitting layer. Accordingly, the width of the gap between adjacent light-emitting layers is larger than the width of the gap between adjacent electron-injection layers. The wider gap between adjacent light-emitting layers enables light emitted from the light-emitting layer to be easily incident on the gap.

Structure Example_1 of Display Device

FIG. 1 is a cross-sectional view illustrating a structure example of a display device 10. The display device 10 includes a transistor 11; an insulating layer 13 over the transistor 11; a light-emitting element 20R, a light-emitting element 20G, and a light-emitting element 20B over the insulating layer 13; a protective layer 43 over the light-emitting element 20R, the light-emitting element 20G, and the light-emitting element 20B; a microlens array 45 over the protective layer 43; an adhesive layer 47 over the microlens array 45; a light-blocking layer 49 over the adhesive layer 47; an insulating layer 51 over the adhesive layer 47 and the light-blocking layer 49; and a substrate 53 over the insulating layer 51. The microlens array 45 is attached to the insulating layer 51 and the light-blocking layer 49 with the adhesive layer 47.

In the case where the expression "B over A" or "B under A" is used in this specification and the like, for example, a region of A and a region of B are not necessarily in contact with each other.

In this specification and the like, the term "element" can be replaced with the term "device" in some cases. For example, a light-emitting element can be referred to as a light-emitting device.

In this specification and the like, when a matter common to the light-emitting element 20R, the light-emitting element 20G, and the light-emitting element 20B is described or it is unnecessary to differentiate between the three elements, they are simply referred to as a "light-emitting element 20". The same applies to other elements.

The light-emitting element 20R includes a lower electrode 21, a hole-injection layer 31, a light-emitting layer 33R, an electron-injection layer 35, and an upper electrode 25. The light-emitting element 20G includes the lower electrode 21, the hole-injection layer 31, a light-emitting layer 33G, the electron-injection layer 35, and the upper electrode 25. The light-emitting element 20B includes the lower electrode 21, the hole-injection layer 31, a light-emitting layer 33B, the electron-injection layer 35, and the upper electrode 25. Here, the hole-injection layer 31, the light-emitting layer 33, and the electron-injection layer 35 are collectively referred to as an EL layer 30.

The light-emitting element 20 can be a top-emission light-emitting element. In the case where the light-emitting element 20 is a top-emission light-emitting element, the lower electrode 21 has a function of reflecting visible light, and the upper electrode 25 has a function of transmitting visible light. The lower electrode 21 has a function of a pixel electrode of the display device 10.

The hole-injection layer 31 contains a material having a hole-injection property. Here, a layer containing a material having a hole-transport property (a hole-transport layer) can be provided between the hole-injection layer 31 and the light-emitting layer 33.

The electron-injection layer 35 contains a material having an electron-injection property. Here, a layer containing a material having an electron-transport property (an electron-transport layer) can be provided between the light-emitting layer 33 and the electron-injection layer 35.

Here, the hole-injection layer 31 and the electron-injection layer 35 may be interchanged. In other words, the electron-injection layer 35, the light-emitting layer 33, and the hole-injection layer 31 may be stacked in this order over the lower electrode 21. In this case, the electron-injection layer 35, an electron-transport layer, the light-emitting layer 33, a hole-transport layer, and the hole-injection layer 31 can be stacked in this order over the lower electrode 21, for example. Although the hole-injection layer 31, the light-emitting layer 33, and the electron-injection layer 35 are stacked in this order over the lower electrode 21 in the description below, the following description can also be applied to the structure in which the electron-injection layer 35, the light-emitting layer 33, and the hole-injection layer 31 are stacked in this order over the lower electrode 21, when "hole" is replaced with "electron" and "electron" is replaced with "hole", for example.

As illustrated in FIG. 1, the lower electrode 21, the hole-injection layer 31, and the electron-injection layer 35 can each be separated between the light-emitting elements 20. In contrast, the upper electrode 25 can be shared between the light-emitting elements 20. In the case where the upper electrode 25 is shared between the light-emitting elements 20, the upper electrode 25 can be referred to as a common electrode. The upper electrode 25 may be separated between the light-emitting elements 20.

The light-emitting layer 33R, the light-emitting layer 33G, and the light-emitting layer 33B can each have a function of emitting light of different colors. The light-emitting layer 33R has a function of emitting red light, the light-emitting layer 33G has a function of emitting green light, and the light-emitting layer 33B has a function of emitting blue light. The light-emitting layer 33R, the light-emitting layer 33G, and the light-emitting layer 33B may have a function of emitting light of a color such as cyan, magenta, or yellow. In addition, although three kinds of light-emitting layers 33 are illustrated in FIG. 1, the display device 10 may include four or more kinds of light-emitting layers 33. For example, the display device 10 may include a light-emitting layer that emits white light as well as the light-emitting layer 33R that emits red light, the light-emitting layer 33G that emits green light, and the light-emitting layer 33B that emits blue light.

In the structure in which the light-emitting layer 33R, the light-emitting layer 33G, and the light-emitting layer 33B emit light of different colors, it can be said that the light-emitting element 20 has an SBS (Side By Side) structure. By employing the SBS structure for the light-emitting element 20, the power consumption of the display device 10 can be reduced compared to the case where all the light-emitting layers 33 emit light of the same color.

The display device 10 includes a pixel 60R, a pixel 60G, and a pixel 60B. The light-emitting element 20R is provided in the pixel 60R, the light-emitting element 20G is provided in the pixel 60G, and the light-emitting element 20B is provided in the pixel 60B.

The transistor 11 is provided in each of the pixel 60R, the pixel 60G, and the pixel 60B. Here, a conductive layer 15 and a conductive layer 17 are embedded in the insulating layer 13, and the transistor 11 is electrically connected to the lower electrode 21 through the conductive layer 15 and the conductive layer 17.

Here, the conductive layer 15 has a function of a wiring, for example. The conductive layer 17 has a function of a plug for electrically connecting the conductive layer 15 to the lower electrode 21, for example.

Furthermore, in this specification and the like, a wiring and a plug electrically connected to the wiring may be one body. In other words, part of the conductive layer can function as a wiring and another part thereof can function as a plug.

The light-blocking layer 49 is provided at a boundary portion between the adjacent pixels 60. With this structure, mixture of light of different colors can be inhibited, so that the display device 10 can display a high-quality image. Although this embodiment exemplifies the structure in which the light-blocking layer 49 is provided, one embodiment of the present invention is not limited thereto, and the light-blocking layer 49 is not necessarily provided.

The protective layer 43 is formed over the upper electrode 25. The protective layer 43 can be an insulating layer; for example, an oxide film, a nitride film, or an oxynitride film can be used. The oxide film can be a layer containing silicon oxide, aluminum oxide, or hafnium oxide. The nitride film can be a layer containing silicon nitride or aluminum nitride. The oxynitride film can be a layer containing silicon oxynitride, silicon nitride oxide, aluminum oxynitride, or aluminum nitride oxide.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The protective layer 43 can be a semiconductor layer, for example, a layer containing a metal oxide containing In, Ga, and Zn (also referred to as IGZO). Alternatively, the protective layer 43 can be a conductive layer and can contain, for example, a light-transmitting conductive material. Although the details will be described later, as a light-transmitting conductive material, for example, a conductive oxide such as indium oxide, indium tin oxide, indium zinc oxide, zinc oxide, or zinc oxide to which gallium is added, or graphene can be used. Alternatively, as a light-transmitting conductive material, an oxide conductor can be used.

The protective layer 43 may have a stacked-layer structure of two or more layers. For example, a stacked-layer structure of an insulating layer and either a semiconductor layer or a conductive layer may be employed. For example, a stacked-layer structure of a layer containing silicon nitride and a layer containing a metal oxide may be employed. Specifically, for example, the protective layer 43 may have a stacked-layer structure of two layers in which a lower layer is a layer containing silicon nitride and an upper layer is a layer containing a metal oxide.

The protective layer 43 is preferably a layer in which impurities such as water and oxygen do not easily diffuse or a layer capable of capturing (also referred to as gettering) impurities such as water and oxygen. This can inhibit impurities from entering the light-emitting element 20, specifically, the EL layer 30, for example. Thus, the reliability of the display device 10 can be increased.

Here, the upper electrode 25 is preferably deposited by a method providing low coverage; for example, the upper electrode 25 is preferably deposited by a method providing lower coverage than the coverage provided by an atomic layer deposition (ALD) method. For example, the upper electrode 25 is deposited by a sputtering method or a chemical vapor deposition (CVD) method. Accordingly, an opening portion isolating the adjacent light-emitting elements 20 from each other is not coated with the upper electrode 25, so that a gap 40 is formed.

The shorter the distance between the electron-injection layers 35 under the upper electrodes 25 is, the more easily the gap 40 is formed. For example, the gap 40 can be suitably formed when the distance is shorter than or equal to 1 μm, preferably shorter than or equal to 500 nm, further preferably shorter than or equal to 200 nm, shorter than or equal to 100 nm, shorter than or equal to 90 nm, shorter than or equal to 70 nm, shorter than or equal to 50 nm, shorter than or equal to 30 nm, shorter than or equal to 20 nm, shorter than or equal to 15 nm, or 10 nm.

The gap 40 contains, for example, any one or more of air, nitrogen, oxygen, carbon dioxide, and a Group 18 element. Furthermore, for example, a gas used during the deposition of the upper electrode 25 is sometimes contained in the gap 40. For example, in the case where the upper electrode 25 is formed by a sputtering method, the gap 40 may contain a Group 18 element (typically, helium, neon, argon, xenon, krypton, or the like). In the case where a gas is contained in the gap 40, a gas can be identified with a gas chromatography method or the like. Alternatively, in the case where the upper electrode 25 is deposited by a sputtering method, a gas used in the sputtering is sometimes contained in the upper electrode 25. In this case, an element such as argon is sometimes detected when the upper electrode 25 is analyzed by energy dispersive X-ray analysis (EDX analysis) or the like.

In the case where the refractive index of the gap 40 is lower than the refractive index of the light-emitting layer 33 or the refractive index of the electron-injection layer 35, light 61 emitted from the light-emitting layer 33 and incident on the interface between the light-emitting layer 33 and the gap 40 or the interface between the electron-injection layer 35 and the gap 40 is totally reflected. This can inhibit entry of the light 61 into the adjacent pixel 60. Specifically, the light 61 emitted from the light-emitting layer 33G can be inhibited from entering the pixel 60R or the pixel 60B, for example. With this structure, mixture of light of different colors can be inhibited, so that the display device 10 can display a high-quality image.

As illustrated in FIG. 1, the electron-injection layer 35 includes a region 63 projecting from the side surface of the light-emitting layer 33. That is, in the top view, the light-emitting layer 33 is formed inward from the electron-injection layer 35. With such a structure, the width of the gap 40 between the adjacent light-emitting layers 33 can be larger than the width of the gap 40 between the adjacent electron-injection layers 35. Thus, light emitted from the light-emitting layer 33 can be easily incident on the gap 40 while entry of the upper electrode 25 into the gap 40 is inhibited, for example. Accordingly, the display device 10 can be a highly reliable display device capable of displaying a high-quality image. Note that in the case where an electron-transport layer is provided between the light-emitting layer 33 and the electron-injection layer 35, the electron-injection layer 35 may have a region projecting from the side surface of the electron-transport layer.

The electron-injection layer 35 may include a region projecting from the side surface of the hole-injection layer 31 and a region projecting from the side surface of the lower electrode 21 in addition to the region projecting from the side surface of the light-emitting layer 33. For example, in the case where the electron-injection layer 35 includes the region projecting from the side surface of the lower electrode 21, the width of the gap 40 between the adjacent lower electrodes 21 is larger than the width of the gap 40 between the adjacent electron-injection layers 35. This can inhibit, for example, the upper electrode 25 and the lower electrode 21, and adjacent lower electrodes 21 from being in contact with each other in the gap 40 and being electrically shorted. Consequently, the reliability of the display device 10 can be increased.

Here, a structure can be employed in which the gap 40 reaches the inside of the insulating layer 13. In this structure, the thickness of the insulating layer 13 in a region where the top surface of the insulating layer 13 is in contact with the bottom surface of the gap 40 is smaller than the thickness of the insulating layer 13 in a region overlapping with the light-emitting layer 33. Moreover, the thickness of the insulating layer 13 in the region where the top surface of the insulating layer 13 is in contact with the bottom surface of the gap 40 can be smaller than the thickness of the insulating layer 13 in a region overlapping with the lower electrode 21 or the hole-injection layer 31.

When the refractive index of the adhesive layer 47 is lower than the refractive index of a microlens included in the microlens array 45, the microlens can condense light emitted from the light-emitting layers 33. This can inhibit entry of the light into the light-blocking layer 49. Therefore, the light extraction efficiency of the display device 10 can be increased. Accordingly, a user of the display device 10 can look at bright images particularly when the user sees a display surface of the display device 10 from the front of the display surface.

Materials that can be used for the components and the like illustrated in FIG. 1 are described below.

[Insulating Layer]

For each of the insulating layers, a single layer of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like or a stacked layer of such materials is used. A material in which a plurality of materials selected from an oxide material, a nitride material, an oxynitride material, and a nitride oxide material are mixed may be used.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS) or the like, for example.

A surface of the insulating layer or the like may be subjected to CMP treatment, for example. By the CMP treatment, unevenness of a sample surface can be reduced, and coverage with an insulating layer and a conductive layer that are formed later can be increased.

[Conductive Layer]

As each of conductive materials that can be used for the gate, the source, and the drain of the transistor and conductive layers such as various wirings, plugs, and electrodes included in the display device, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing the above metal element as a component; an alloy containing some of the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

As the conductive material that can be used for the conductive layer, a conductive material containing oxygen, such as an indium tin oxide (ITO), an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can also be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used.

The conductive material that can be used for the conductive layer may have a single-layer structure or a stacked-layer structure of two or more layers. For example, the conductive layer may have a single layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure including a titanium layer, an aluminum layer stacked over the titanium layer, and a titanium layer formed thereover. Alternatively, an aluminum alloy containing one or more elements of titanium, tantalum, tungsten, molybdenum, chromium, neodymium, and scandium may be used as the conductive material.

In the case where the light-emitting element 20 is a top-emission light-emitting element, the lower electrode 21 is preferably formed using a conductive material that efficiently reflects light emitted from the light-emitting layer 33. Note that the structure of the lower electrode 21 may have a stacked-layer structure of a plurality of layers without limitation to a single-layer structure. For example, in the case where the lower electrode 21 is used as an anode, a layer in contact with the hole-injection layer 31 may be a light-transmitting layer, such as an indium tin oxide layer, and a layer having high reflectance (e.g., aluminum, an alloy containing aluminum, or silver) may be provided in contact with the layer. When the upper electrode 25 is formed using a light-transmitting conductive material, light emitted from the light-emitting layer 33 can be efficiently extracted to the outside of the display device 10.

As the conductive material that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material and/or the alloy. Furthermore, an alloy containing aluminum (an aluminum alloy) such as an alloy of aluminum and titanium, an alloy of aluminum and nickel, or an alloy of aluminum and neodymium, or an alloy containing silver, such as an alloy of silver and copper, an alloy of silver, palladium, and copper, or an alloy of silver and magnesium may be used, for example. An alloy containing silver and copper is preferable because of its high heat resistance. Furthermore, a metal film or an alloy film may be stacked with a metal oxide film. For example, when a metal film or a metal oxide film is stacked so as to be in contact with an aluminum alloy film, oxidation of the aluminum alloy film can be inhibited. Other examples of the metal film or the metal oxide film are titanium and titanium oxide.

Alternatively, as described above, the conductive film having a light-transmitting property and a film containing a metal material may be stacked. For example, a stacked-layer film of silver and indium tin oxide, a stacked-layer film of an alloy of silver and magnesium and indium tin oxide, or the like can be used.

As the conductive material having a light-transmitting property, a conductive oxide such as indium oxide, indium tin oxide, indium zinc oxide, zinc oxide, or zinc oxide to which gallium is added, or graphene can be used. Alternatively, as the conductive material having a light-transmitting property, an oxide conductor can be used. A metal material such as gold, silver, platinum, magnesium, nickel, tungsten, chromium, molybdenum, iron, cobalt, copper, palladium, or titanium, or an alloy material containing the metal material can also be used. Further alternatively, a nitride of the metal material (e.g., titanium nitride) or the like may be used. Note that in the case of using the metal material or the alloy material (or the nitride thereof), the thickness is set small enough to be able to transmit light. A stacked-layer film of any of the above materials can be used as a conductive layer. For example, a stacked-layer film of indium tin oxide and an alloy of silver and magnesium, or the like is preferably used for higher conductivity. These can also be used for conductive layers such as a variety of wirings and electrodes included in a display device, and conductive layers (conductive layers functioning as the lower electrode or the upper electrode) included in the light-emitting element.

Here, an oxide conductor, which is one type of metal oxide, is described. In this specification and the like, an oxide conductor may be referred to as OC (Oxide Conductor). As the oxide conductor, for example, an oxygen vacancy is formed in a metal oxide (typically, IGZO), which is an oxide containing at least indium or zinc, and hydrogen is added to the oxygen vacancy, so that a donor level is formed in the vicinity of the conduction band. As a result, the conductivity of the metal oxide is increased, so that the metal oxide can serve as a conductor. The metal oxide that can serve as a conductor can be referred to as an oxide conductor. A metal oxide (oxide semiconductor) having a function of semiconductor generally has a visible-light transmitting property because of their large energy gap. Meanwhile, the oxide conductor is a metal oxide having a donor level in the vicinity of the conduction band. Therefore, the influence of absorption due to the donor level is small in the oxide conductor, and the oxide conductor has a visible-light transmitting property comparable to that of an oxide semiconductor.

[EL Layer]

Either a low molecular compound or a high molecular compound can be used for each of the layers included in the EL layer 30, and an inorganic compound may also be included. Each of the layers included in the EL layer 30 can be formed by an evaporation method (including a vacuum evaporation method), a transfer method, a printing method, a coating method, or the like.

Specifically, the hole-injection layer 31 included in the EL layer 30 contains a material having a hole-transport property. For example, an aromatic amine compound or an organic compound having a π-electron rich heteroaromatic ring can be used as the material having a hole-transport property.

As the material having a hole-transport property in the composite material, for example, a compound having an aromatic amine skeleton, a carbazole derivative, an aromatic hydrocarbon, an aromatic hydrocarbon having a vinyl group, a high molecular compound (such as an oligomer, a dendrimer, or a polymer), or the like can be used. A material having a hole mobility of $1\times10^{-6}$ $cm^2/Vs$ or higher can be suitably used as the material having a hole-transport property.

Furthermore, a substance having any of a carbazole skeleton, a dibenzofuran skeleton, a dibenzothiophene skeleton, and an anthracene skeleton can be suitably used as the material having a hole-transport property in the composite material, for example. Moreover, as the material having a hole-transport property in the composite material, it is possible to use an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl) amino group, the reliability of the light-emitting element can be increased.

The electron-injection layer 35 included in the EL layer 30 contains a material having an electron-transport property. For example, a compound having an unshared electron pair and an electron deficient heteroaromatic ring can be used as the material having an electron-transport property. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance. Note that the chemical formulae of BPhen, NBPhen, HANTA, and TmPPPyTz described above are shown below.

[Chemical Formulas 1]

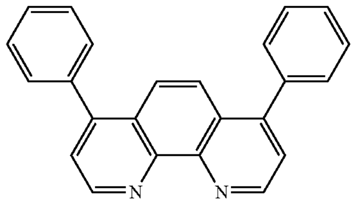

BPhen

-continued

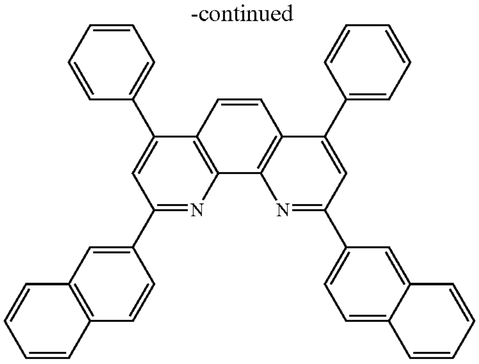

NBPhen

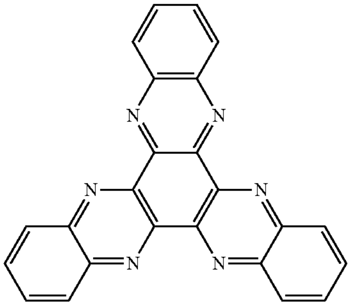

HATNA

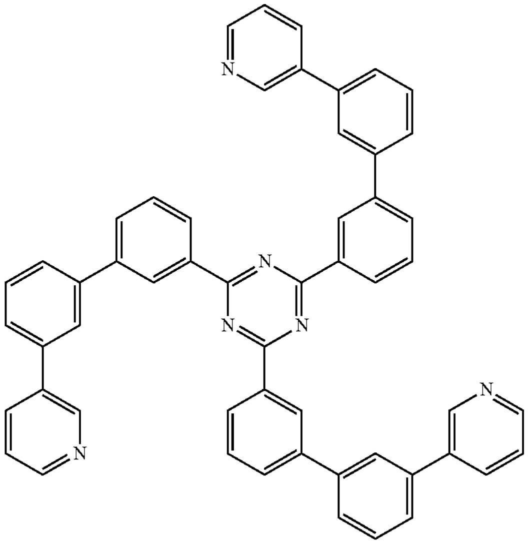

TmPPPyTz

Alternatively, for example, copper phthalocyanine can be used for the organic compound having an unshared electron pair. The number of electrons of the copper phthalocyanine is an odd number.

The electron-injection layer 35 can include a metal. For example, the electron-injection layer 35 can include a metal and the above-described organic compound having an unshared electron pair. Here, the sum of the number of electrons of the organic compound and the number of electrons of the metal is preferably an odd number. For example, the electron-injection layer 35 preferably includes NBPhen and silver. The molar ratio of the metal to 1 mol of the organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the organic compound having an unshared electron pair interacts with the metal and thus can form a singly occupied molecular orbital (SOMO). Furthermore, in the case where electrons are injected from the upper electrode 25 into the electron-injection layer, a barrier therebetween can be reduced. The metal has a low reactivity with water and oxygen; thus, the moisture resistance of the light-emitting element 20 can be improved.

[Adhesive Layer]

As the adhesive layer 47, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be used. It is preferable to use a material common to the coloring layer and the light-blocking layer, in which case common equipment can be used and a process can be simplified.

Example_1 of Method for Manufacturing Display Device

An example of a method for manufacturing the display device 10 illustrated in FIG. 1 will be described below.

Note that an insulating layer, a semiconductor layer, a conductive layer for forming the electrode, the wirings, and the like, which are included in the display device, can be formed by a sputtering method, a CVD method, a vacuum evaporation method, a pulsed laser deposition (PLD) method, an ALD method, a plasma ALD (PEALD, Plasma Enhanced ALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

In addition, the insulating layer, the semiconductor layer, the conductive layer used for forming electrodes and wirings, and the like included in the display device may be formed by a method such as spin coating, dipping, spray coating, ink-jetting, dispensing, screen printing, offset printing, slit coating, roll coating, curtain coating, or knife coating.

A PECVD method can provide a high-quality film at a relatively low temperature. With use of a deposition method that does not use plasma at the time of deposition, such as an MOCVD method, an ALD method, or a thermal CVD method, damage is not easily caused on a surface where the film is deposited. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, in the case of a deposition method not using plasma, such plasma damage is not caused; thus, the yield of semiconductor devices can be increased. Moreover, since plasma damage during deposition is not caused, a film with few defects can be obtained.

Furthermore, when the oxide semiconductor film is formed by a sputtering method, a chamber of a sputtering apparatus is preferably evacuated to a high vacuum (to the degree of approximately $5\times10^{-7}$ Pa to $1\times10^{-4}$ Pa, for example) by an adsorption vacuum evacuation pump such as a cryopump, so that water and the like acting as an impurity for the oxide semiconductor film are removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. The deposition temperature is preferably higher than or equal to room temperature and lower than or equal to 500° C., further preferably higher than or equal to room temperature and lower than or equal to 300° C., still further preferably higher than or equal to room temperature and lower than or equal to 200° C.

In addition, increasing the purity of a sputtering gas is necessary. For example, as an oxygen gas and an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture or the like into the oxide semiconductor film can be inhibited as much as possible.

In the case where the insulating layer, the conductive layer, the semiconductor layer, or the like is formed by a sputtering method using a sputtering gas containing oxygen, oxygen can be supplied to a surface over which such a layer is formed. As the amount of oxygen contained in the sputtering gas increases, the amount of oxygen supplied to the layer over which such a layer is formed tends to increase.

For processing of the layers (thin films) included in the display device, a photolithography method or the like can be employed. Alternatively, island-shaped layers may be formed by a deposition method using a blocking mask. Alternatively, the layers may be processed by a nanoimprinting method, a sandblasting method, a lift-off method, or the like. As a photolithography method, a method in which a resist mask is formed over a layer (thin film) to be processed, part of the layer (thin film) is selectively removed by using the resist mask as a mask, and the resist mask is removed, and a method in which a photosensitive layer is deposited, and then the layer is exposed to light and developed to be processed into a desired shape are given.

In the case of using light in the photolithography method, for example, an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultra-violet light, X-rays, or an electron beam because extremely minute processing can be performed. Note that when light exposure is performed by scanning of a beam such as an electron beam, a photomask is unnecessary.

For removal (etching) of the layers (thin films), a dry etching method, a wet etching method, or the like can be used. Alternatively, the etching methods may be used in combination.

Figure 2A:
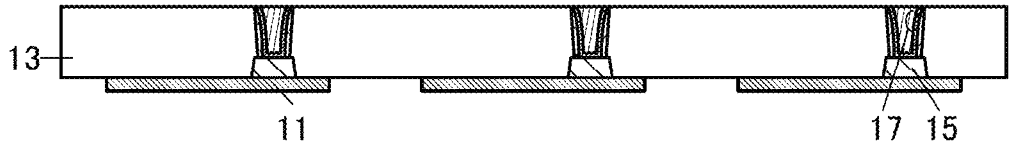
FIG. 2A to FIG. 2E are cross-sectional views illustrating an example of a method for manufacturing a display device.

In order to manufacture the display device 10 illustrated in FIG. 1, first, the conductive layer 15 is formed so as to be electrically connected to the transistor 11. Next, the insulating layer 13 is formed over the transistor 11 and the conductive layer 15. After that, an opening portion reaching the conductive layer 15 is formed in the insulating layer 13 and the conductive layer 17 is formed in the opening portion (FIG. 2A).

Figure 2B:
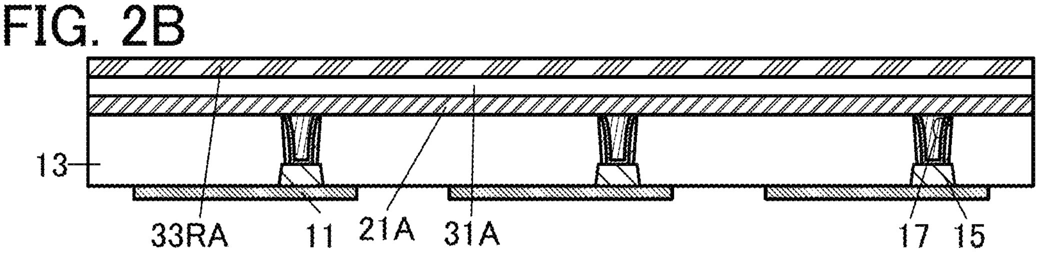

Next, over the insulating layer 13 and the conductive layer 17, a layer 21A to be the lower electrode 21, a layer 31A to be the hole-injection layer 31, and a layer 33RA to be the light-emitting layer 33R are deposited in this order (FIG. 2B). The layer 21A, the layer 31A, and the layer 33RA can be deposited by, for example, an evaporation method or a sputtering method. Without limitation to this, any of the above-described deposition methods can be employed as appropriate. In the case where a hole-transport layer is provided over the hole-injection layer 31, a layer to be the hole-transport layer is deposited over the layer 31A and then the layer 33RA is deposited. In the case where an electron-transport layer is provided over the light-emitting layer 33R, the layer 33RA is deposited and then a layer to be the electron-transport layer is deposited.

Figure 2C:
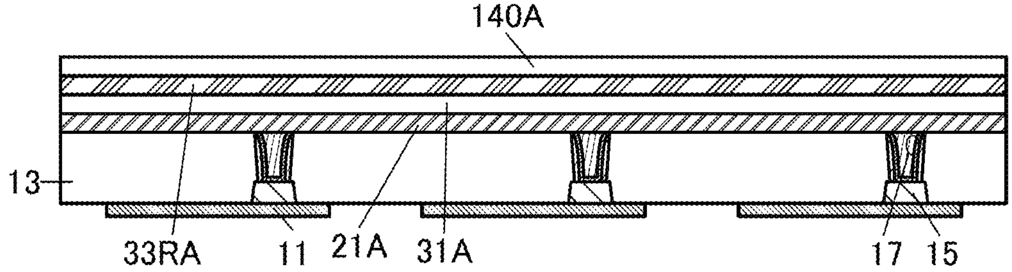

After that, a layer 140A is deposited over the layer 33RA (FIG. 2C). The layer 140A can be deposited by a wet process such as spin coating, dipping, spray coating, ink-jetting, dispensing, screen printing, offset printing, a doctor knife method, slit coating, roll coating, curtain coating, and knife coating. Note that any other deposition method may be employed, and the above-described deposition methods such as an evaporation method can be employed as appropriate.

For the layer 140A, a material that can be dissolved in a chemically stable solvent is preferably used. Specifically, a material that is dissolved in water or alcohol can be suitably used for the layer 140A. In deposition of the layer 140A, it is preferable that application of such a material dissolved in a solvent such as water or alcohol be performed by the aforementioned wet process and followed by heat treatment for evaporating the solvent. At this time, the heat treatment is preferably performed under a reduced-pressure atmosphere, in which case the solvent can be removed at a low temperature in a short time and thermal damage to the layer 33RA can be accordingly reduced.

For the layer 140A, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin can be used.

Figure 2D:
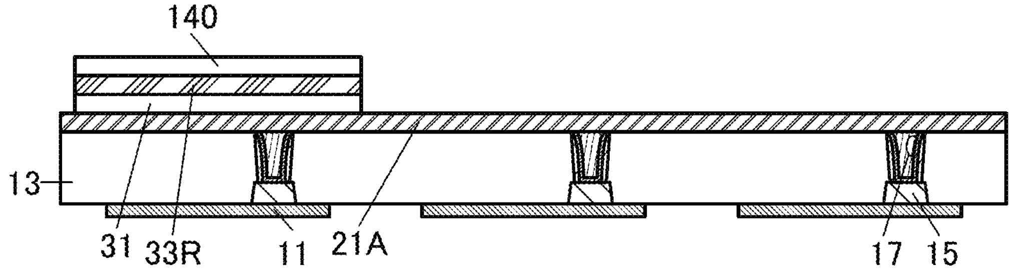

Next, the layer 140A, the layer 33RA, and the layer 31A are processed by an etching method or the like. Specifically, for example, a resist mask is formed over the layer 140A, and then the layer 140A, the layer 33RA, and the layer 31A are processed by an etching method or the like. Accordingly, for example, a sacrificial layer 140, the light-emitting layer 33R, and the hole-injection layer 31 each having an island shape can be formed (FIG. 2D). That is, the layer 140A is a layer to be the sacrificial layer 140 over the light-emitting layer 33R.

Figure 2E:
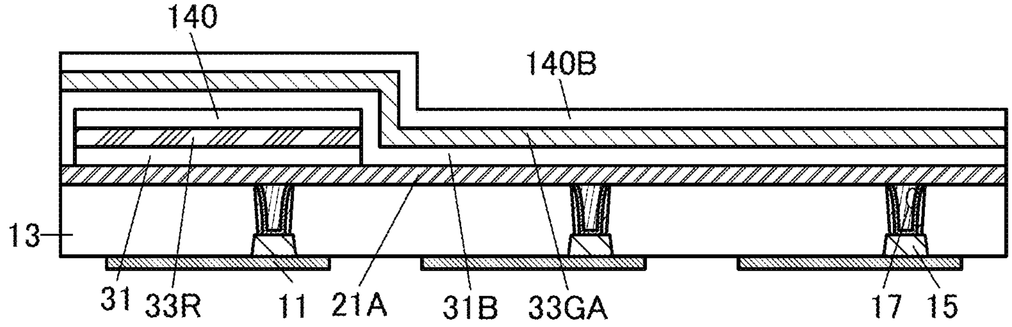

Then, over the layer 21A and the sacrificial layer 140, a layer 31B to be the hole-injection layer 31, a layer 33GA to be the light-emitting layer 33G, and a layer 140B are deposited (FIG. 2E). The layer 31B can be deposited by a deposition method similar to that for the layer 31A, the layer 33GA can be deposited by a deposition method similar to that for the layer 33RA, and the layer 140B can be deposited by a deposition method similar to that for the layer 140A. The layer 140B can contain a material similar to that of the layer 140A. In the case where a hole-transport layer is provided over the hole-injection layer 31, a layer to be the hole-transport layer is deposited over the layer 31B and then the layer 33GA is deposited. In the case where an electron-transport layer is provided over the light-emitting layer 33G, the layer 33GA is deposited and then a layer to be the electron-transport layer is deposited.

Figure 3A:
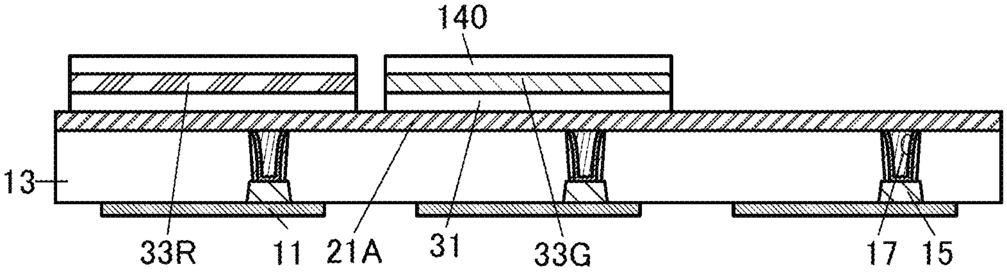
FIG. 3A to FIG. 3D are cross-sectional views illustrating an example of a method for manufacturing a display device.

Next, the layer 140B, the layer 33GA, and the layer 31B are processed by an etching method or the like. Specifically, for example, a resist mask is formed over the layer 140B, and then the layer 140B, the layer 33GA, and the layer 31B are processed by an etching method or the like. Accordingly, for example, the sacrificial layer 140, the light-emitting layer 33G, and the hole-injection layer 31 each having an island shape can be formed (FIG. 3A). That is, the layer 140B is a layer to be the sacrificial layer 140 over the light-emitting layer 33G.

Figure 3B:
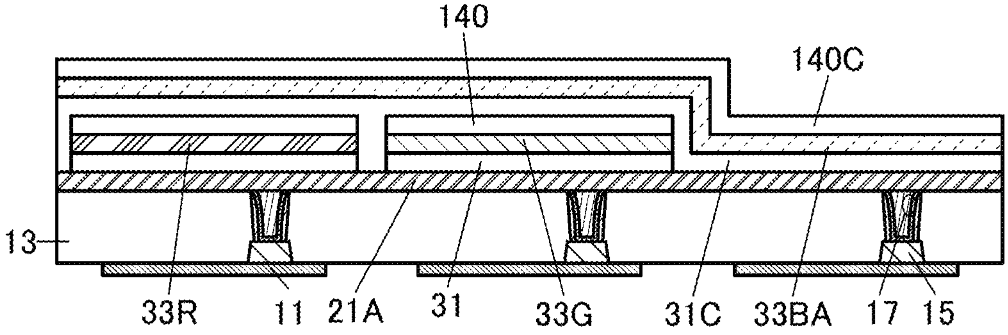

Then, over the layer 21A and the sacrificial layer 140, a layer 31C to be the hole-injection layer 31, a layer 33BA to be the light-emitting layer 33B, and a layer 140C are deposited (FIG. 3B). The layer 31C can be deposited by a deposition method similar to that for the layer 31A, the layer 33BA can be deposited by a deposition method similar to that for the layer 33RA, and the layer 140C can be deposited by a deposition method similar to that for the layer 140A. The layer 140C can contain a material similar to that of the layer 140A. In the case where a hole-transport layer is provided over the hole-injection layer 31, a layer to be the hole-transport layer is deposited over the layer 31C and then the layer 33BA is deposited. In the case where an electron-transport layer is provided over the light-emitting layer 33B, the layer 33BA is deposited and then a layer to be the electron-transport layer is deposited.

Figure 3C:
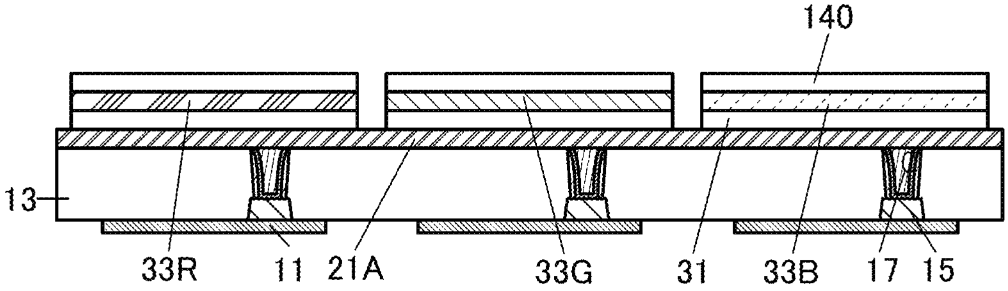

Next, the layer 140C, the layer 33BA, and the layer 31C are processed by an etching method or the like. Specifically, for example, a resist mask is formed over the layer 140C, and then the layer 140C, the layer 33BA, and the layer 31C are processed by an etching method or the like. Accordingly, for example, the sacrificial layer 140, the light-emitting layer 33B, and the hole-injection layer 31 each having an island shape can be formed (FIG. 3C). That is, the layer 140C is a layer to be the sacrificial layer 140 over the light-emitting layer 33B.

Figure 3D:
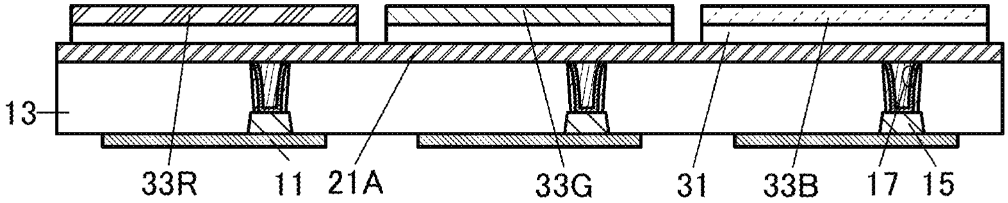

Then, the sacrificial layer 140 is removed, whereby the top surfaces of the light-emitting layer 33R, the light-emitting layer 33G, and the light-emitting layer 33B are exposed (FIG. 3D).

The sacrificial layer 140 can be removed by an etching method. At this time, a method that causes damage to the light-emitting layer 33R, the light-emitting layer 33G, and the light-emitting layer 33B as little as possible is preferably employed. In particular, the sacrificial layer 140 is preferably removed by being dissolved in a solvent such as water or alcohol. As the alcohol in which the sacrificial layer 140 can be dissolved, any of various alcohols such as ethyl alcohol, methyl alcohol, isopropyl alcohol (IPA), and glycerin can be used.

After the sacrificial layer 140 is removed, drying treatment is preferably performed in order to remove water contained in the light-emitting layer 33R, the light-emitting layer 33G, and the light-emitting layer 33B and water adsorbed on the surfaces of the light-emitting layer 33R, the light-emitting layer 33G, and the light-emitting layer 33B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 120° C., further preferably higher than or equal to 70° C. and lower than or equal to 100° C. A reduced-pressure atmosphere is preferable because drying at a lower temperature is possible.

Through the above steps, the light-emitting layer 33R, the light-emitting layer 33G, and the light-emitting layer 33B can be separately formed, for example. As described above, in one embodiment of the present invention, a metal mask, specifically, a fine metal mask is not used for separately forming the light-emitting layer 33R, the light-emitting layer 33G, and the light-emitting layer 33B, for example. Therefore, one embodiment of the present invention can be a method for manufacturing a display device with high productivity. Note that the light-emitting layers 33 are not necessarily formed in the order of the light-emitting layer 33R, the light-emitting layer 33G, and the light-emitting layer 33B and can be formed in any order. For example, it is possible that after the light-emitting layer 33B is formed, the light-emitting layer 33G is formed, and then the light-emitting layer 33R is formed.

In the case of forming the light-emitting element 20 with use of a fine metal mask, it is difficult to set the distance between the light-emitting elements 20 to shorter than or equal to 20 μm due to limitation on dimensional accuracy. Meanwhile, in the method for manufacturing a display device of one embodiment of the present invention, the light-emitting elements 20 are formed without using a fine metal mask; thus, the distance between the adjacent light-emitting elements 20 can be shorter than or equal to 20 μm. For example, the distance between the adjacent electron-injection layers 35 can be shorter than or equal to 20 μm. Specifically, the distance between the adjacent light-emitting elements 20 can be longer than or equal to 0.5 μm and shorter than or equal to 15 μm, preferably longer than or equal to 0.5 μm and shorter than or equal to 10 μm, further preferably longer than or equal to 0.5 μm and shorter than or equal to 5 μm. Thus, an increase in the aperture ratio of the pixel, higher resolution, a smaller size, and the like can be achieved.

In this specification and the like, a device formed using a metal mask or an FMM (a fine metal mask, a high-resolution metal mask) may be referred to as a device having an MM (a metal mask) structure. In this specification and the like, a device formed without using a metal mask or an FMM is sometimes referred to as a device having an MML (metal maskless) structure Note that in the case where the distance between the light-emitting elements 20 is set to shorter than or equal to 100 nm, typically shorter than or equal to 90 nm, an optimal light-exposure apparatus is needed. For example, as the light-exposure apparatus, a stepper, a scanner, and the like can be used. A light source that can be used for the light-exposure apparatus has a wavelength of 13 nm (EUV), 157 nm (F2), 193 nm (ArF), 248 nm (KrF), 308 nm (XeCl), 365 nm (an i-line), 436 nm (a g-line), or the like. With the light source having a short wavelength, a high-resolution or miniaturized display device can be provided.

Figure 4A:
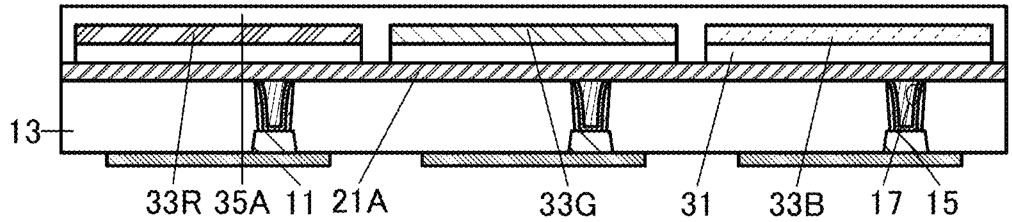
FIG. 4A to FIG. 4E are cross-sectional views illustrating an example of a method for manufacturing a display device.

Next, a layer 35A to be the electron-injection layer 35 is deposited over the light-emitting layer 33R, the light-emitting layer 33G, the light-emitting layer 33B, and the layer 21A (FIG. 4A). The layer 35A can be deposited by, for example, an evaporation method or a sputtering method. Without limitation to this, any of the above-described deposition methods can be employed as appropriate.

Figure 4B:
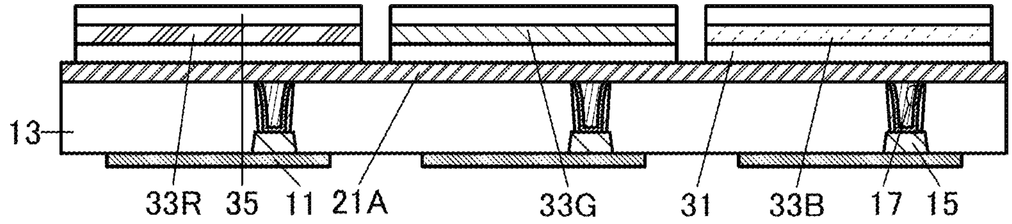

Then, the layer 35A is processed by an etching method or the like. Specifically, a resist mask is formed over the layer 35A, and then the layer 35A is processed by an etching method or the like, for example. Thus, for example, the electron-injection layer 35 having an island shape can be formed (FIG. 4B).

Figure 4C:
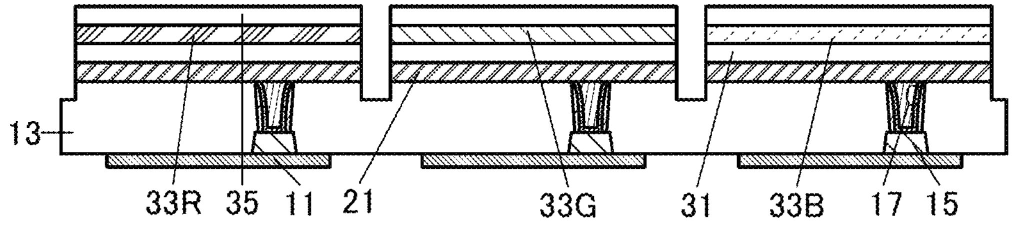

Next, the layer 21A is processed by an etching method or the like using the electron-injection layer 35 as a mask. Thus, for example, the lower electrode 21 having an island shape can be formed (FIG. 4C). The lower electrode 21 is formed by processing the layer 21A using the electron-injection layer 35 as a mask; therefore, it can be said that the lower electrode 21 is formed in a self-aligned manner.

Note that as illustrated in FIG. 4C, the insulating layer 13 is sometimes also etched during the etching of the layer 21A. Thus, the thickness of the insulating layer 13 in a region overlapping with a region where the layer 21A is processed is smaller than the thickness of the insulating layer 13 in a region overlapping with the lower electrode 21 in some cases.

Figure 4D:
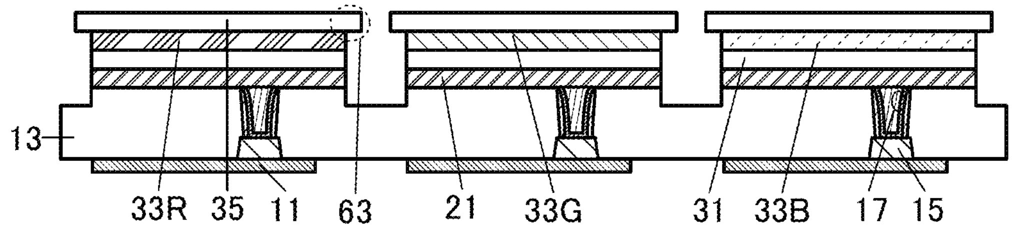

After that, the light-emitting layer 33, the hole-injection layer 31, and the lower electrode 21 are etched in the horizontal direction. As a result, the electron-injection layer 35 includes the region 63 projecting from the side surfaces of the light-emitting layer 33 and the like (FIG. 4D). As the etching in the horizontal direction, highly isotropic etching can be performed, for example. The etching of the layer 140A, the layer 33RA, and the layer 31A illustrated in FIG. 2C to FIG. 2D is first etching; etching of the layer 140B, the layer 33GA, and the layer 31B illustrated in FIG. 2E to FIG. 3A is second etching; etching of the layer 140C, the layer 33BA, and the layer 31C illustrated in FIG. 3B to FIG. 3C is third etching; etching of the layer 35A illustrated in FIG. 4A to FIG. 4B is fourth etching; and etching illustrated in FIG. 4C to FIG. 4D is fifth etching, for example. In that case, the fifth etching has preferably lower anisotropy, that is, higher isotropy than the first to fourth etching.

In this specification and the like, in the case where the layer 140A, the layer 33RA, and the layer 31A are etched by the first etching, for example, the layer 140A, the layer 33RA, and the layer 31A are not necessarily etched collectively. For example, it is possible that after the layer 140A is etched, the etching condition is changed and the layer 33RA is etched, and the etching condition is then changed again, and the layer 31A is etched. Also in this case, it can be regarded that the layer 140A, the layer 33RA, and the layer 31A are all etched by the first etching. The same applies to the second and subsequent etching and the like.

As illustrated in FIG. 4D, the insulating layer 13 is also etched in the horizontal direction in some cases by the etching in the horizontal direction of the light-emitting layer 33, the hole-injection layer 31, and the lower electrode 21. The hole-injection layer 31 and the lower electrode 21 are not necessarily be etched in the horizontal direction. In this case, the insulating layer 13 is not etched in the horizontal direction in some cases. In the case where an electron-transport layer is provided between the light-emitting layer 33 and the electron-injection layer 35, the electron-transport layer may be etched in the horizontal direction.

Figure 4E:
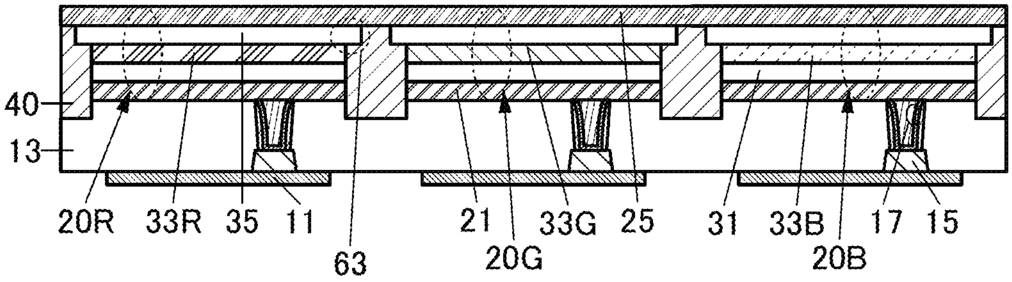

Next, the upper electrode 25 is formed. The upper electrode 25 is preferably formed by a method providing low coverage, for example, deposition with a method providing coverage lower than the coverage provided by an ALD method is preferable. For example, the upper electrode 25 is deposited by a sputtering method or a CVD method. Accordingly, the opening portion that isolates the adjacent light-emitting elements 20 from each other is not coated with the upper electrode 25, and the gap 40 is formed (FIG. 4E).

Figure 5A:
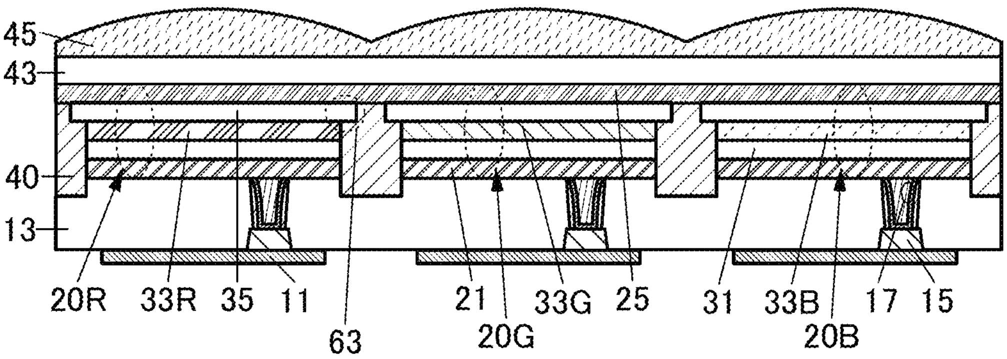
FIG. 5A and FIG. 5B are cross-sectional views illustrating an example of a method for manufacturing a display device.

After that, the protective layer 43 is formed, and the microlens array 45 is formed over the protective layer 43 (FIG. 5A). The microlens array 45 can be formed in a manner in which a resist pattern is formed by a photolithography method, for example, and then the resist is reflowed by heat treatment.

Figure 5B:
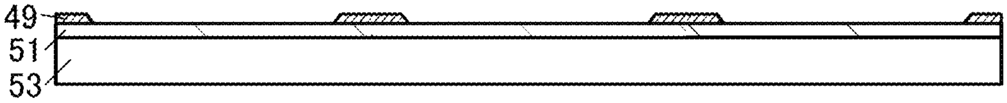

Next, the substrate 53 is prepared, the insulating layer 51 is formed over the substrate 53, and the light-blocking layer 49 is formed over the insulating layer 51 (FIG. 5B). After that, the adhesive layer 47 is formed over the insulating layer 51 and the light-blocking layer 49, and the insulating layer 51 and the light-blocking layer 49 are attached to the microlens array 45 with the adhesive layer 47. The adhesive layer 47 can be formed by a screen printing method, a dispensing method, or the like. Through the above steps, the display device 10 illustrated in FIG. 1 can be manufactured.

Structure Example_2 of Display Device

Figure 6:
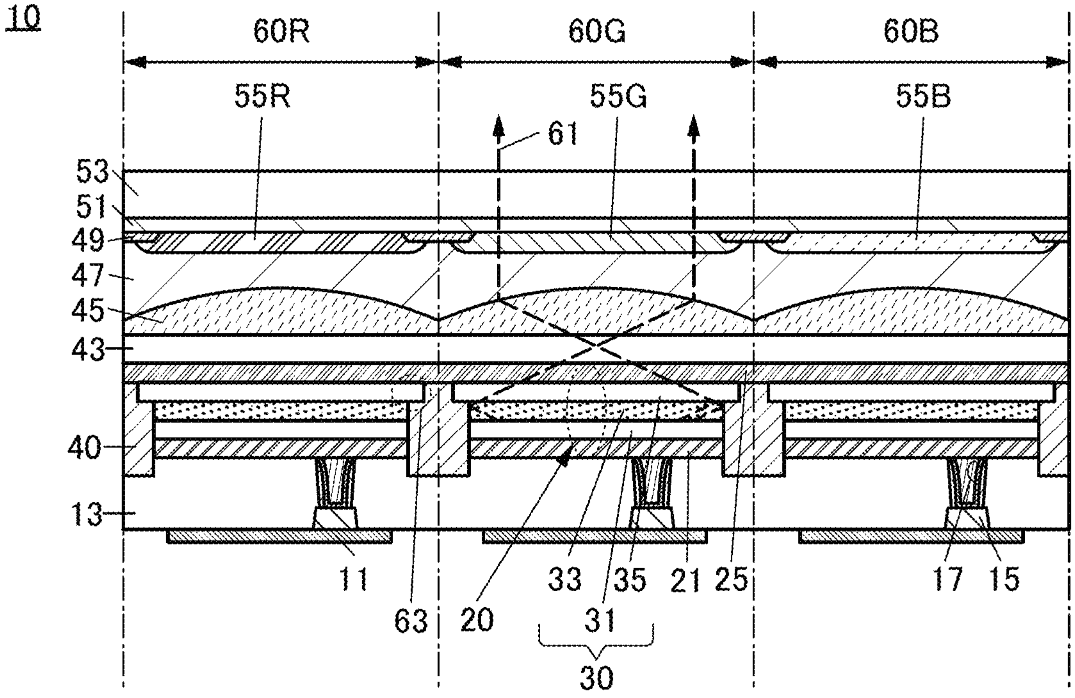
FIG. 6 is a cross-sectional view illustrating a structure example of a display device.

FIG. 6 is a cross-sectional view illustrating a structure example of the display device 10 and is a variation example of the display device 10 illustrated in FIG. 1. The display device 10 illustrated in FIG. 6 is different from the display device 10 illustrated in FIG. 1 in that a coloring layer 55R is provided in the pixel 60R, a coloring layer 55G is provided in the pixel 60G, and a coloring layer 55B is provided in the pixel 60B.

When the insulating layer 51 is provided over the substrate 53, the coloring layer 55 is provided over the insulating layer 51. The coloring layer 55 is provided to have regions in contact with the light-blocking layer 49 at the both ends of the coloring layer 55. The coloring layer 55 can be formed after the formation of the light-blocking layer 49.

The coloring layer 55 can change the hue of light passing therethrough. For example, the hue of light passing through the coloring layer 55R can be red, the hue of light passing through the coloring layer 55G can be green, and the hue of the light passing through the coloring layer 55B can be blue. Note that the hue of light passing through the coloring layer 55 may be cyan, magenta, yellow, or the like.

Since the coloring layer 55 is provided in the display device 10, it is unnecessary to separately form the light-emitting layers 33 for respective colors. For example, all the light-emitting layers 33 can be layers emitting white light. Thus, the manufacturing process of the display device 10 can be simplified. Thus, the manufacturing cost of the display device 10 can be decreased and the yield can be increased. Accordingly, the display device 10 can be provided at lower cost.

Examples of a material that can be used for the coloring layer 55 include a metal material, a resin material, and a resin material containing a pigment or a dye.

Example_2 of Method for Manufacturing Display Device

An example of a method for manufacturing the display device 10 illustrated in FIG. 6 will be described below with reference to drawings. Note that the description of the same steps as those of the display device 10 illustrated in FIG. 1 is omitted as appropriate.

Figure 7A:
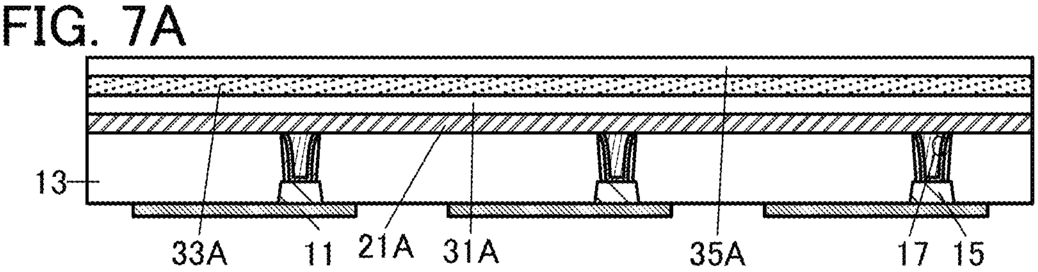
FIG. 7A to FIG. 7D are cross-sectional views illustrating an example of a method for manufacturing a display device.

First, components up to the layer 31A are formed by a method similar to the method illustrated in FIG. 2A and FIG. 2B. Next, a layer 33A to be the light-emitting layer 33 and a layer 35A to be the electron-injection layer 35 are formed over the layer 31A (FIG. 7A). The layer 33A can be formed by a method similar to the layer 33RA, the layer 33GA, or the layer 33BA.

Figure 7B:
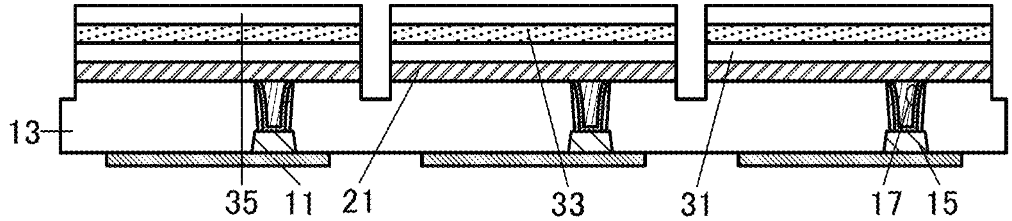

Next, the layer 35A, the layer 33A, the layer 31A, and the layer 21A are processed by an etching method or the like. Specifically, a resist mask is formed over the layer 35A, and then the layer 35A, the layer 33A, the layer 31A, and the layer 21A are processed by an etching method or the like. In this manner, for example, the electron-injection layer 35, the light-emitting layer 33, the hole-injection layer 31, and the lower electrode 21 that each have an island shape can be formed (FIG. 7B). Note that the insulating layer 13 is also sometimes etched in the etching of the layer 21A as described above. Thus, the thickness of the insulating layer 13 in a region overlapping with the region where the layer 21A has been processed is sometimes smaller than the thickness of the insulating layer 13 in a region overlapping with the lower electrode 21.

Figure 7C:
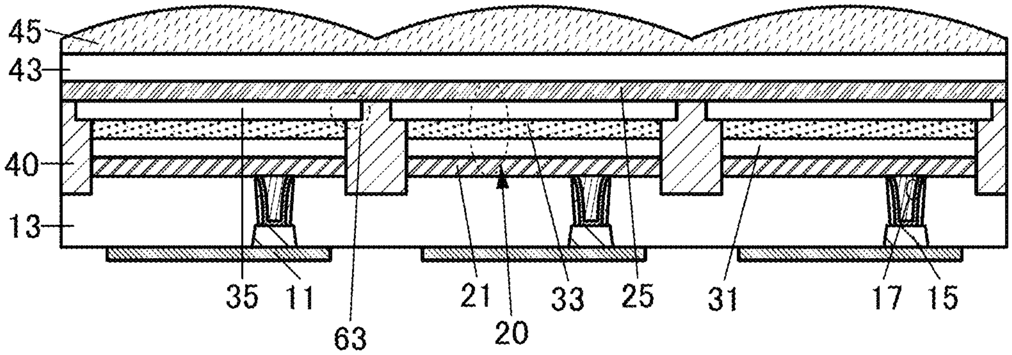

Then, the light-emitting layer 33, the hole-injection layer 31, and the lower electrode 21 are etched in the horizontal direction by a method similar to the method illustrated in FIG. 4D. After that, by a method similar to the method illustrated in FIG. 4E and FIG. 5A, the upper electrode 25, the protective layer 43, and the microlens array 45 are formed (FIG. 7C).

Figure 7D:
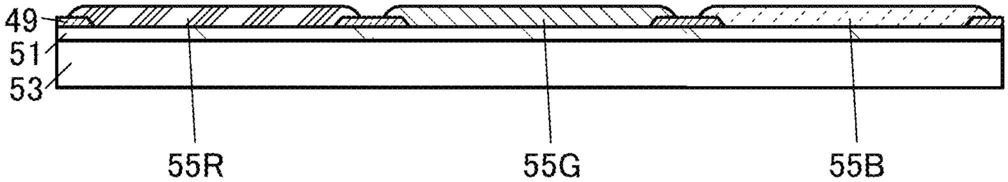

Next, the substrate 53 is prepared; the insulating layer 51 is formed over the substrate 53; the light-blocking layer 49 is formed over the insulating layer 51; and then the coloring layer 55R, the coloring layer 55G, and the coloring layer 55B are formed over the insulating layer 51 and the light-blocking layer 49 (FIG. 7D). After that, the adhesive layer 47 is formed over the coloring layer 55R, the coloring layer 55G, the coloring layer 55B, and the light-blocking layer 49, and the microlens array 45 is attached to the coloring layer 55 and the light-blocking layer 49 with the adhesive layer 47. The adhesive layer 47 can be formed by a screen printing method, a dispensing method, or the like. Through the above steps, the display device 10 illustrated in FIG. 6 can be manufactured.

As described above, the display device 10 illustrated in FIG. 6 can be formed without formation of the sacrifice layer 140 to separately form the light-emitting layers 33 for respective colors. Thus, the manufacturing process of the display device 10 can be simplified. Thus, the manufacturing cost of the display device 10 can be decreased and the yield can be made increased.

Accordingly, the display device 10 can be provided at lower cost.

Structure Example_3 of Display Device

Figure 8:
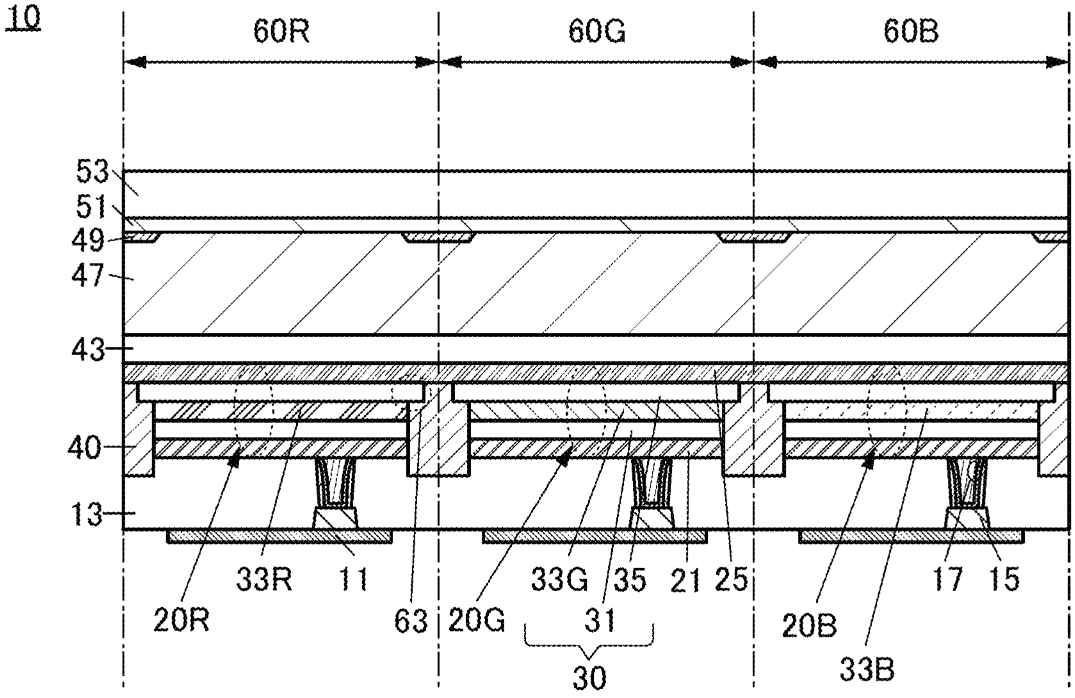
FIG. 8 is a cross-sectional view illustrating a structure example of a display device.

FIG. 8 is a cross-sectional view illustrating a structure example of the display device 10 and is a variation example of the display device 10 illustrated in FIG. 1. The display device 10 illustrated in FIG. 8 is different from the display device 10 illustrated in FIG. 1 in not including the microlens array 45. When the display device 10 does not include the microlens array 45, the manufacturing process of the display device 10 can be simplified. This can achieve low manufacturing cost and high yield of the display device 10. Accordingly, the display device 10 can be provided at lower cost. Note that the display device 10 illustrated in a drawing other than FIG. 1, such as FIG. 6, can also employ the structure not including the microlens array 45.

Figure 9:
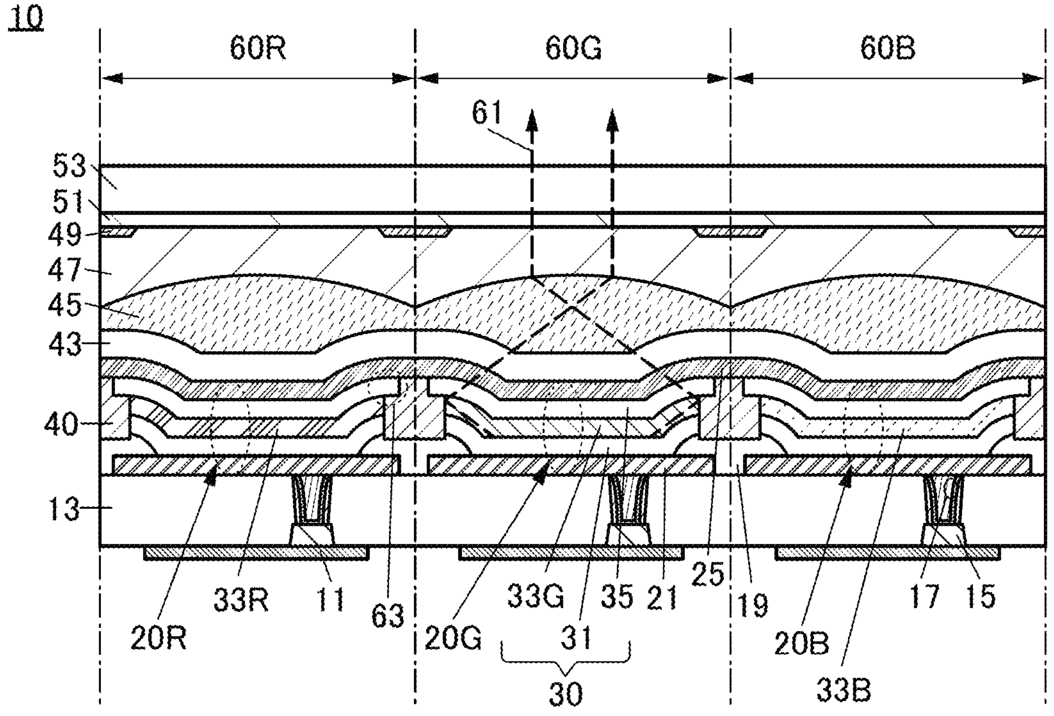
FIG. 9 is a cross-sectional view illustrating a structure example of a display device.

FIG. 9 is a cross-sectional view illustrating a structure example of the display device 10 and is a variation example of the display device 10 illustrated in FIG. 1. The display device 10 illustrated in FIG. 9 is different from the display device 10 illustrated in FIG. 1 in that a partition 19 is provided over the insulating layer 13. The partition 19 can be an insulating layer, for example.

The partition 19 is provided between the adjacent pixels 60 and is provided to cover an end portion of the lower electrode 21. In the display device 10 illustrated in FIG. 9, the hole-injection layer 31 is provided over the lower electrode 21 and the partition 19. Note that each of the hole-injection layer 31 and the light-emitting layer 33 does not necessarily include a region overlapping with the partition 19. In addition, the electron-injection layer 35 does not necessarily include a region overlapping with the partition 19.

The provision of the partition 19 can inhibit an electrical short circuit that can be generated between the adjacent lower electrodes 21, etc. Meanwhile, a structure not provided with the partition 19 can increase the aperture ratio. In the structure not provided with the partition 19, the aperture ratio of the pixel can be higher than or equal to 70%, preferably higher than or equal to 80%, further preferably higher than or equal to 90%.

In the case of manufacturing the display device 10 illustrated in FIG. 9, part of the partition 19 may be etched when the layer to be the hole-injection layer 31 is etched into, for example, an island shape. Moreover, when the light-emitting layer 33 and the hole-injection layer 31 are etched in the horizontal direction, the partition 19 may also be etched in the horizontal direction. In the above manner, a structure in which the gap 40 reaches the inside of the partition 19 can be formed.

Note that in the case of manufacturing the display device 10 illustrated in FIG. 9, etching of the lower electrode 21 in the horizontal direction is not performed. The display device 10 illustrated in FIG. 9 is provided with the partition 19; thus, even when part of the upper electrode reaches the inside of the gap 40, for example, the upper electrode 25 and the lower electrode 21 are not electrically short-circuited by being in contact with each other inside the gap 40.

Figure 10:
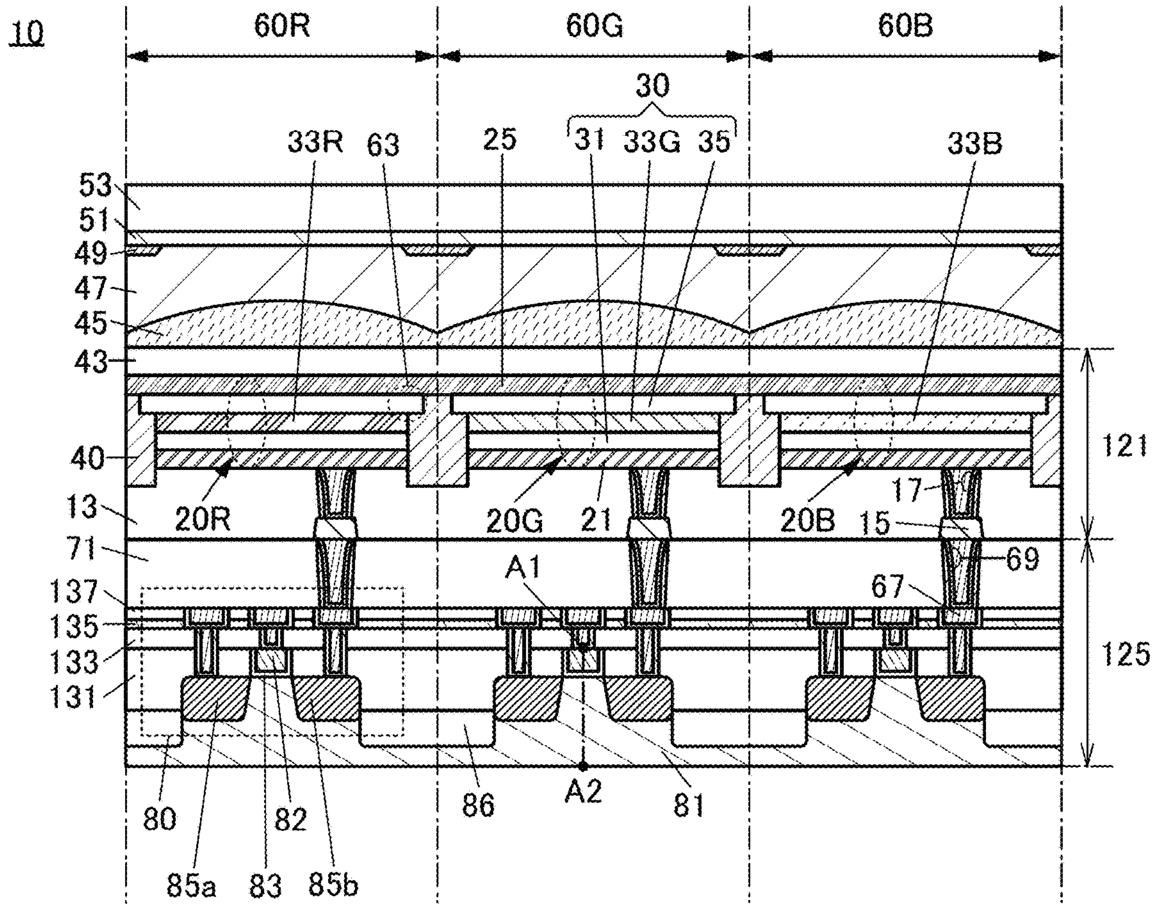
FIG. 10 is a cross-sectional view illustrating a structure example of a display device.

FIG. 10 is a cross-sectional view illustrating a structure example of the display device 10. FIG. 10 is the cross-sectional view illustrating an example of a structure under the insulating layer 13 in the display device 10 illustrated in FIG. 1.

As illustrated in FIG. 10, the display device 10 includes transistors 80 and element isolation layers 86 over a substrate 81. Over the substrate 81, an insulating layer 131, an insulating layer 133, an insulating layer 135, and an insulating layer 137 are provided.

The display device 10 includes an insulating layer 71 over the insulating layer 137 and the insulating layer 13 over the insulating layer 71. Although FIG. 10 illustrates the structure provided with the insulating layer 71 as an example, one embodiment of the present invention is not limited thereto. For example, a structure provided with not the insulating layer 71 but the insulating layer 13 over the insulating layer 137 may be employed.

The display device 10 further includes a conductive layer 67 and a conductive layer 69. The conductive layer 67 is embedded in the insulating layer 131, the insulating layer 133, the insulating layer 135, and the insulating layer 137, and the conductive layer 69 is embedded in the insulating layer 71. Furthermore, the conductive layer 67 and the insulating layer 137 can be substantially level with each other and the conductive layer 69 and the insulating layer 71 can be substantially level with each other.

As illustrated in FIG. 10, the light-emitting element 20 and the transistor 80 are provided to be stacked. Here, a layer where the light-emitting element 20 is provided is referred to as a layer 121 and a layer where the transistor 80 is provided is referred to as a layer 125.

The transistor 80 is provided in each of the pixel 60R, the pixel 60G, and the pixel 60B. One of a source and a drain of the transistor 80 is electrically connected to the lower electrode 21 included in the light-emitting element 20R, the lower electrode 21 included in the light-emitting element 20G, or the lower electrode 21 included in the light-emitting element 20B through the conductive layer 67, the conductive layer 69, the conductive layer 15, and the conductive layer 17. That is, in the display device 10 illustrated in FIG. 10, the transistor 80 corresponds to the transistor 11 illustrated in FIG. 1 or the like.

Here, the conductive layer 69 has a function of a plug for electrically connecting the conductive layer 67 to the conductive layer 15, for example.

In the layer 125, a transistor included in a driver circuit such as a scan line driver circuit can be formed in addition to the transistor included in the pixel 60.

The transistor 80 can be a transistor including silicon in a channel formation region (Si transistor). Silicon included in the Si transistor can be single crystal silicon, polycrystalline silicon (polysilicon), amorphous silicon, or the like. In particular, the channel formation region of the transistor 80 is preferably formed using single crystal silicon.

The transistor 80 includes a conductive layer 82 having a function of a gate electrode, the insulating layer 83 having a function of a gate insulating layer, and part of the substrate 81. In addition, the transistor 80 includes a semiconductor region including a channel formation region, a low-resistance region 85*a* having a function of one of a source region and a drain region, and a low-resistance region 85*b* having a function of the other of the source and the drain region. The transistor 80 may be either a p-channel transistor or an n-channel transistor. Alternatively, the transistor 80 may be a CMOS (Complementary Metal Oxide Semiconductor) transistor in which an n-channel transistor and a p-channel transistor are combined.

The transistor 80 is electrically isolated from other transistors by the element isolation layer 86. In FIG. 10, the transistors 80 are electrically isolated from each other by the element isolation layer 86. The element isolation layer 86 can be formed by a LOCOS (LOCal Oxidation of Silicon) method, an STI (Shallow Trench Isolation) method, or the like.

Figure 11A:
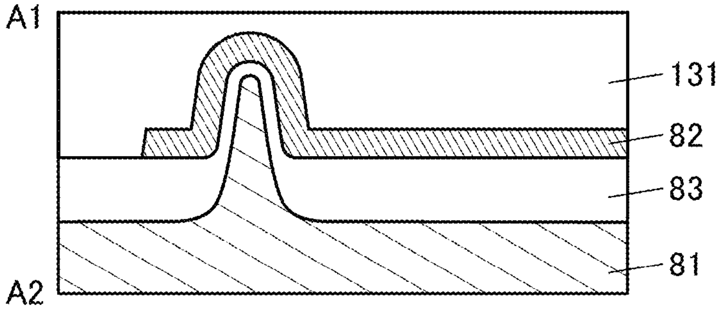
FIG. 11A to FIG. 11C are cross-sectional views illustrating structure examples of a transistor.

FIG. 11A is a cross-sectional view illustrating a structure example in the channel width direction (A1-A2 direction) of the transistor 80 illustrated in FIG. 10.

As illustrated in FIG. 10 and FIG. 11A, the semiconductor region of the transistor 80 includes a protrusion shape. Moreover, the conductive layer 82 is provided to cover the side surface and the top surface of the semiconductor region with the insulating layer 83 therebetween. A material with which the work function can be adjusted can be used for the conductive layer 82.

A transistor having a semiconductor region with a protrusion shape, like the transistor 80 illustrated in FIG. 10 and FIG. 11A, can be referred to as a fin-type transistor because a protrusion portion of a semiconductor substrate is used. An insulator having a function of a mask for forming a protrusion portion may be provided in contact with an upper portion of the protrusion portion. Although FIG. 10 illustrates the structure in which the protrusion portion is formed by processing part of the substrate 81, a semiconductor having a protrusion shape may be formed by processing an SOI (Silicon On Insulator) substrate.

Figure 11B:
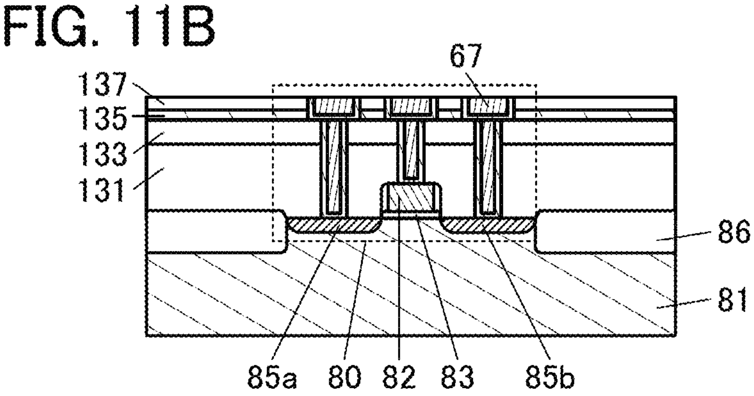
Figure 11C:
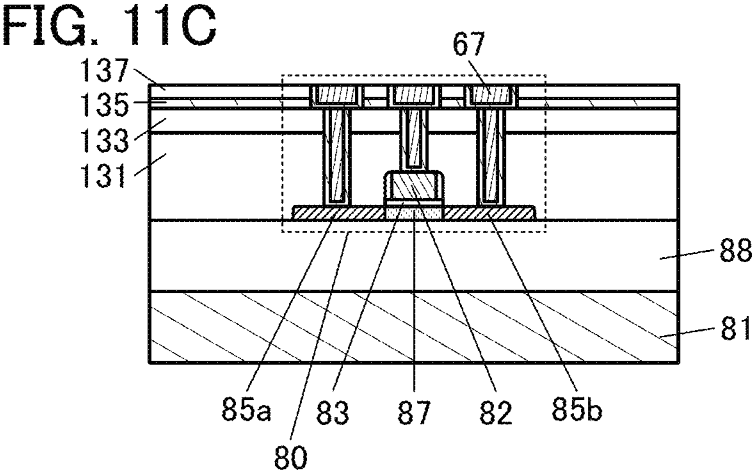

FIG. 11B and FIG. 11C are cross-sectional views each illustrating a structural example of the transistor 80 in the channel length direction and variation examples of the transistor 80 illustrated in FIG. 10. The transistor 80 illustrated in FIG. 11B is a planar transistor, which is different from the transistor 80 illustrated in FIG. 10. In addition, the structure illustrated in FIG. 11C is different from that illustrated in FIG. 10 in that an insulating layer 88 is provided over the substrate 81 and the transistor 80 is provided over the insulating layer 88.

The transistor 80 illustrated in FIG. 11C includes a semiconductor layer 87. The semiconductor layer 87 can be a thin film, e.g., a thin film including silicon. Specifically, the semiconductor layer 87 can be a thin film including amorphous silicon or low-temperature polysilicon. The semiconductor layer 87 can be single crystal silicon (SOI) formed over the insulating layer 88.

For example, the insulating layer 131, the insulating layer 133, the insulating layer 135, the insulating layer 137, and the insulating layer 71 illustrated in FIG. 10 each function as an interlayer film. The insulating layer 131, the insulating layer 133, the insulating layer 135, the insulating layer 137, and the insulating layer 71 may each have a function of a planarization layer with which a roughness shape thereunder is coated.

Materials or the like that can be used for the substrate 81 and the substrate 53 are described below.

There is no great limitation on materials used for the substrate 81 and the substrate 53. The material is determined by the purpose in consideration of whether it has a light-transmitting property, heat resistance high enough to withstand heat treatment, or the like. For example, a glass substrate such as barium borosilicate glass or aluminosilicate glass; a ceramics substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. As the semiconductor substrate, a single-crystal semiconductor or a polycrystalline semiconductor may be used.

In order that the flexibility of the display device 10 can be increased, a flexible substrate, an attachment film, a base film, or the like may be used for each of the substrate 81 and the substrate 53.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display device can be provided. Furthermore, when the above-described material is used for the substrate, a shock-resistant display device can be provided. Moreover, when the above-described material is used for the substrate, a display device that is less likely to be broken can be provided.

The flexible substrate used as the substrate 81 and the substrate 53 preferably has a lower coefficient of linear expansion because deformation due to an environment is inhibited. For the flexible substrate used as the substrate 81 and the substrate 53, for example, a material whose coefficient of linear expansion is lower than or equal to $1\times10^{-3}$/K, lower than or equal to $5\times10^{-5}$/K, or lower than or equal to $1\times10^{-5}$/K can be used. In particular, aramid is preferable for the flexible substrate because of its low coefficient of linear expansion.

Figure 12:
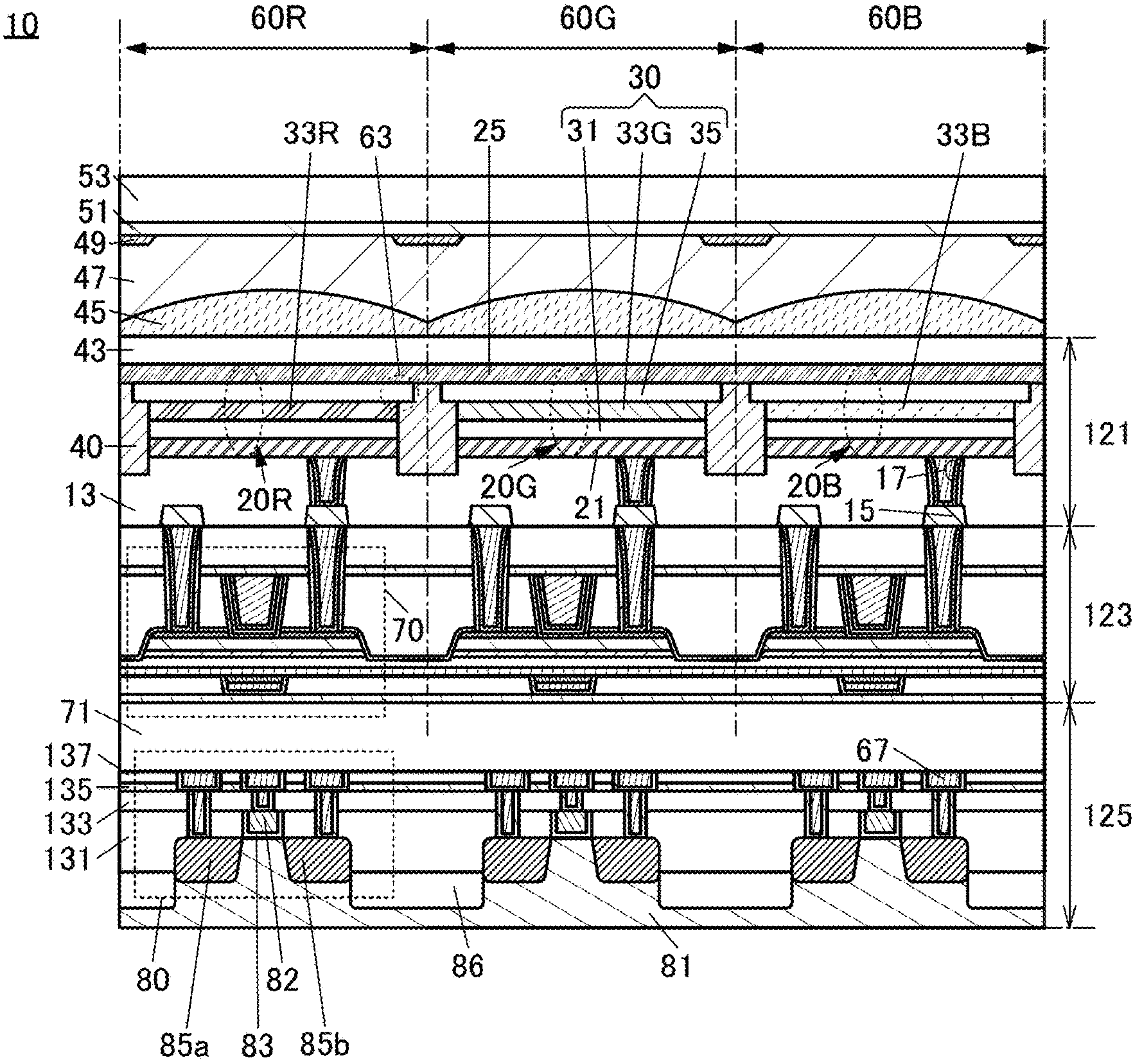
FIG. 12 is a cross-sectional view illustrating a structure example of a display device.

FIG. 12 is a cross-sectional view illustrating a structure example of the display device 10, and is a variation example of the display device 10 illustrated in FIG. 10. The display device 10 illustrated in FIG. 12 is different from the display device 10 illustrated in FIG. 10 in that a layer 123 is provided between the layer 121 and the layer 125.

A transistor 70 is provided in the layer 123. The transistor 70 is provided in each of the pixel 60R, the pixel 60G, and the pixel 60B. In the display device 10 illustrated in FIG. 12, one of a source and a drain of the transistor 70 is electrically connected to the lower electrode 21 of the light-emitting element 20R, the lower electrode 21 of the light-emitting element 20G, or the lower electrode 21 of the light-emitting element 20B through the conductive layer 15 and the conductive layer 17. In other words, the transistor 70 in the display device 10 illustrated in FIG. 10 corresponds to the transistor 11 illustrated in FIG. 1 and the like.

A transistor containing a metal oxide in its channel formation region (OS transistor) can be used as the transistor 70. The metal oxide included in the OS transistor preferably contains at least indium or zinc. In particular, indium and zinc are preferably contained. In addition to them, aluminum, gallium, yttrium, tin, or the like is preferably contained. Furthermore, one or more kinds of boron, titanium, iron, nickel, germanium, zirconium, molybdenum, lanthanum, cerium, neodymium, hafnium, tantalum, tungsten, magnesium, cobalt, and the like may be contained.

Structure Example_4 of Display Device

Figure 13:
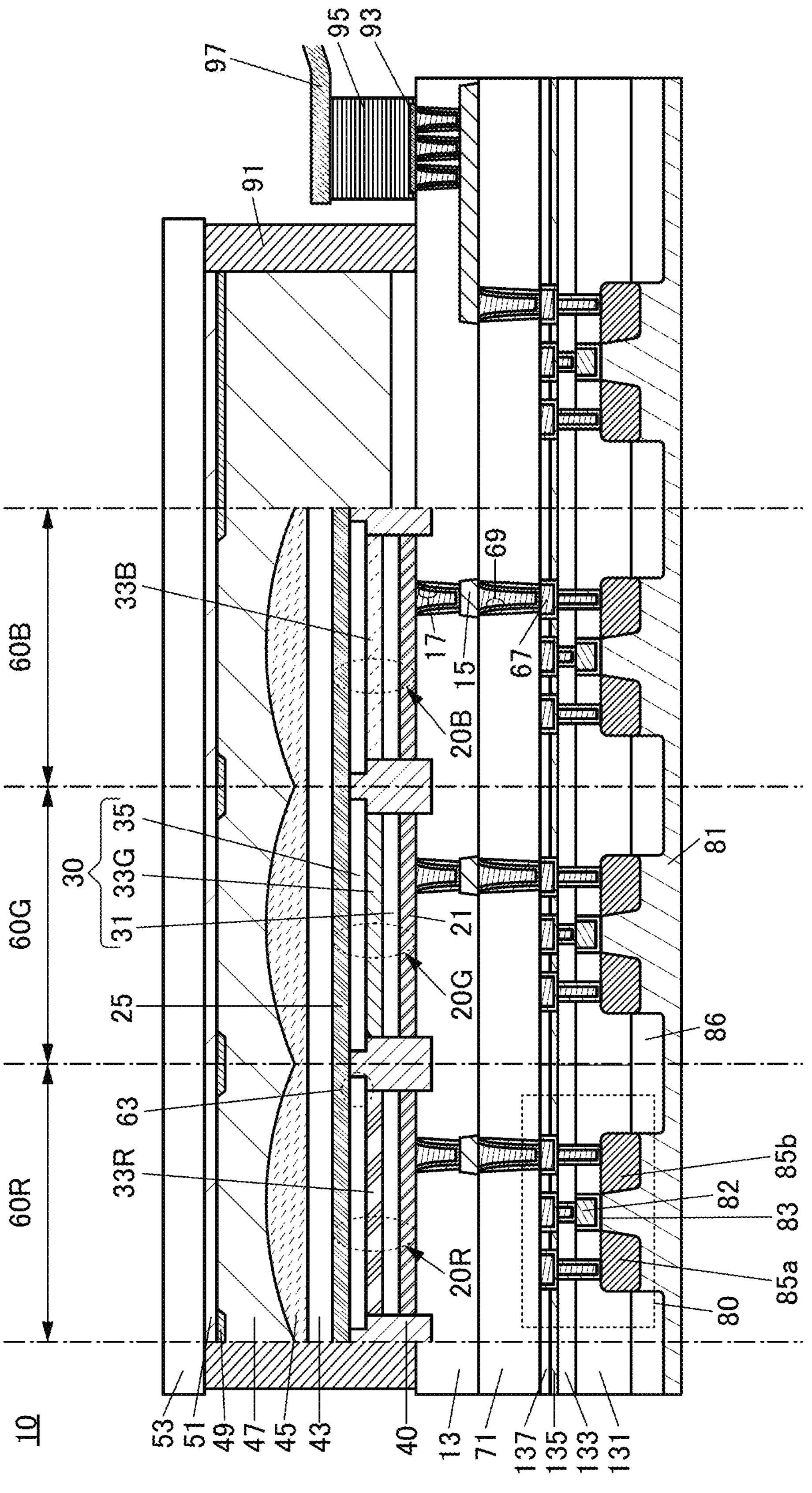
FIG. 13 is a cross-sectional view illustrating a structure example of a display device.

FIG. 13 is a cross-sectional view illustrating a structure example of the display device 10, and illustrates a sealant 91, a connection electrode 93, an anisotropic conductive layer 95, a flexible printed circuit (FPC) 97, and the like in addition to the structure illustrated in FIG. 10.

The substrate 53 and the insulating layer 13 are attached to each other with the sealant 91 as illustrated in FIG. 13. For example, the connection electrode 93 is provided over the insulating layer 13 and the conductive layer 17 so as to be electrically connected to one of the source and the drain of the transistor 80. The anisotropic conductive layer 95 is provided so as to be electrically connected to the connection electrode 93, and the FPC 97 is provided so as to be electrically connected to the anisotropic conductive layer 95. A variety of signals or the like are supplied to the display device 10 from the outside of the display device 10 through the FPC 97. The sealant 91 may be omitted, and the FPC 97 may be wire-bonded.

Figure 14:
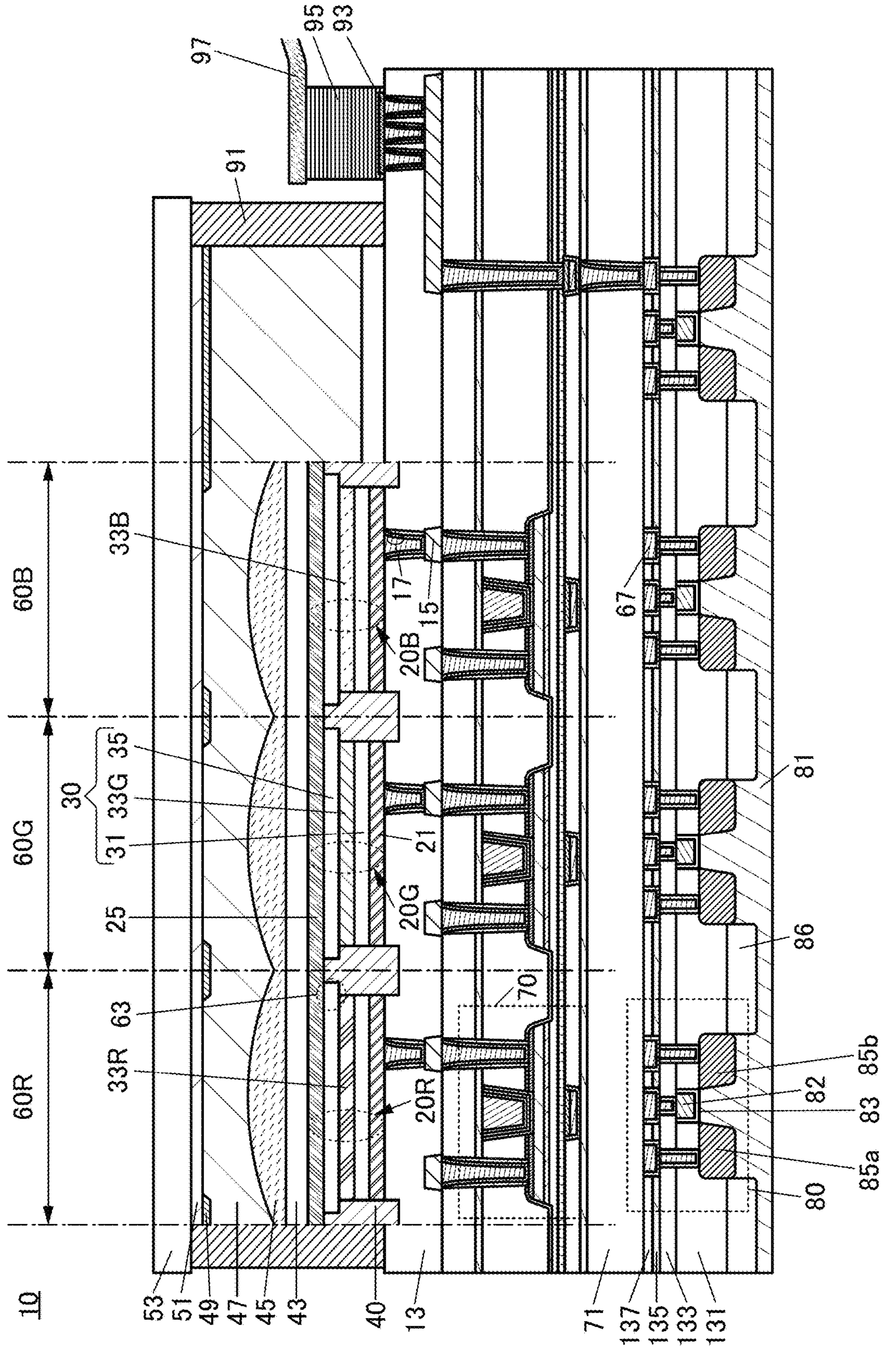
FIG. 14 is a cross-sectional view illustrating a structure example of a display device.

FIG. 14 is a cross-sectional view illustrating a structure example of the display device 10 and is a variation example of the display device 10 illustrated in FIG. 13. The display device 10 illustrated in FIG. 14 is different from the display device 10 illustrated in FIG. 13 in that the transistor 70 that can be used as an OS transistor or the like is included.

Figure 15A:
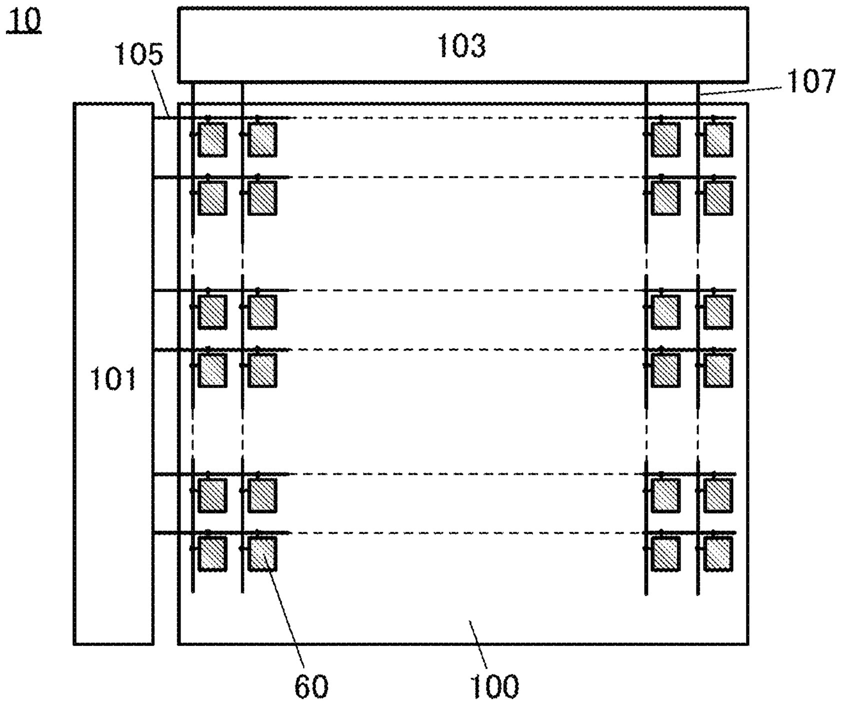
FIG. 15A is a block diagram illustrating a structure example of a display device.

FIG. 15A is a block diagram illustrating a structure example of the display device 10. The display device 10 includes a display portion 100, a scan line driver circuit 101, and a data line driver circuit 103. Pixels 60 are arranged in a matrix in the display portion 100. The scan line driver circuit 101 and the data line driver circuit 103 can each include the transistor 80.

The scan line driver circuit 101 is electrically connected to the pixels 60 through a wiring 105. The data line driver circuit 103 is electrically connected to the pixels 60 through a wiring 107. The wiring 105 and the wiring 107 can extended in directions perpendicular to each other.

The scan line driver circuit 101 has a function of generating a selection signal for selecting the pixels 60 to which image data is written. The data line driver circuit 103 has a function of generating a signal (data signal) representing image data. The selection signal is supplied to the pixels 60 through the wiring 105, and the data signal is supplied to the pixels 60 through the wiring 107.

Figure 15B:
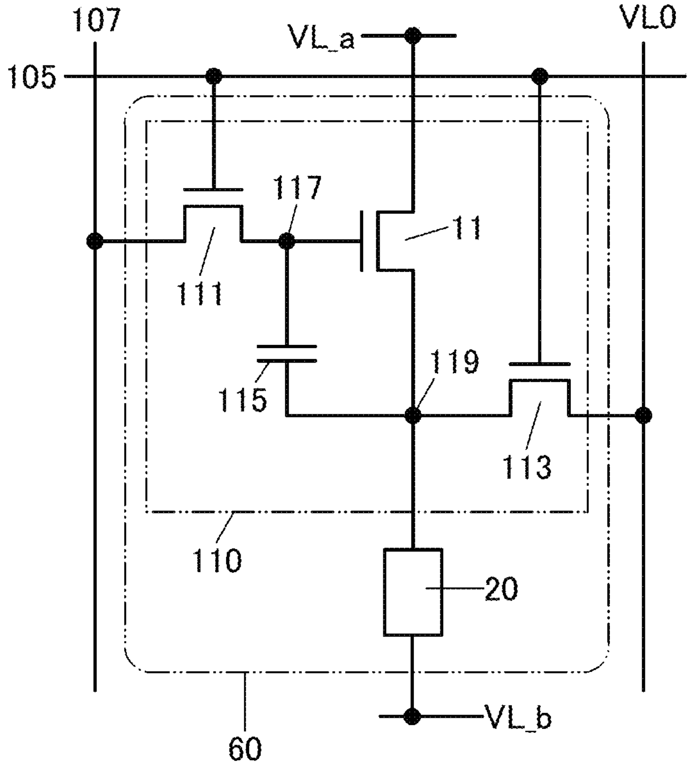
FIG. 15B is a circuit diagram illustrating a structure example of a pixel.

FIG. 15B is a circuit diagram illustrating a configuration example of the pixel 60. The pixel 60 includes the light-emitting element 20 and a pixel circuit 110.

The pixel circuit 110 includes the transistor 111, a transistor 11, a transistor 113, and a capacitor 115. The pixel circuit 110 is electrically connected to one electrode of the light-emitting element 20. As described above, the transistor 11 can be the transistor 80 illustrated in FIG. 10 and the like or the transistor 70 illustrated in FIG. 12 and the like.

One of a source and a drain of the transistor 111 is electrically connected to a gate of the transistor 11. The gate of the transistor 11 is electrically connected to one electrode of the capacitor 115. One of a source and a drain of the transistor 11 is electrically connected to one of a source and a drain of the transistor 113. The one of the source and the drain of the transistor 113 is electrically connected to the other electrode of the capacitor 115. The other electrode of the capacitor 115 is electrically connected to one electrode of the light-emitting element 20. Here, a node to which the one of the source and the drain of the transistor 111, the gate of the transistor 11, and the one electrode of the capacitor 115 are electrically connected is referred to as a node 117. A node to which the one of the source and the drain of the transistor 11, the one of the source and the drain of the transistor 113, the other electrode of the capacitor 115, and the one electrode of the light-emitting element 20 are electrically connected is referred to as a node 119.

The other of the source and the drain of the transistor 111 is electrically connected to the wiring 107. A gate of the transistor 111 and a gate of the transistor 113 are electrically connected to the wiring 105. The other of the source and the drain of the transistor 11 is electrically connected to the potential supply line VL_a. The other of the source and the drain of the transistor 113 is electrically connected to the potential supply line VL0. The other electrode of the light-emitting element 20 is electrically connected to the potential supply line VL_b.

The transistor 111 has a function of controlling the writing of image data to the node 117. The capacitor 115 has the function of a storage capacitor for retaining data written to the node 117.

In the display device including the pixel circuit 110, the pixel circuit 110 in each row is sequentially selected to turn on the transistor 111 and the transistor 113 by the scan line driver circuit 101, whereby image data is written to the node 117.

The pixel circuit 110 in which image data has been written to the node 117 has a holding state, when the transistor 111 and the transistor 113 are turned off. In addition, the amount of current flowing between the drain and the source of the transistor 11 is controlled in accordance with the potential of the node 119 so that the light-emitting element 20 emits light with luminance corresponding to the amount of the current. This operation is sequentially performed row by row; thus, an image can be displayed on the display portion 100.

Structure Example of Transistor

Figure 16A:
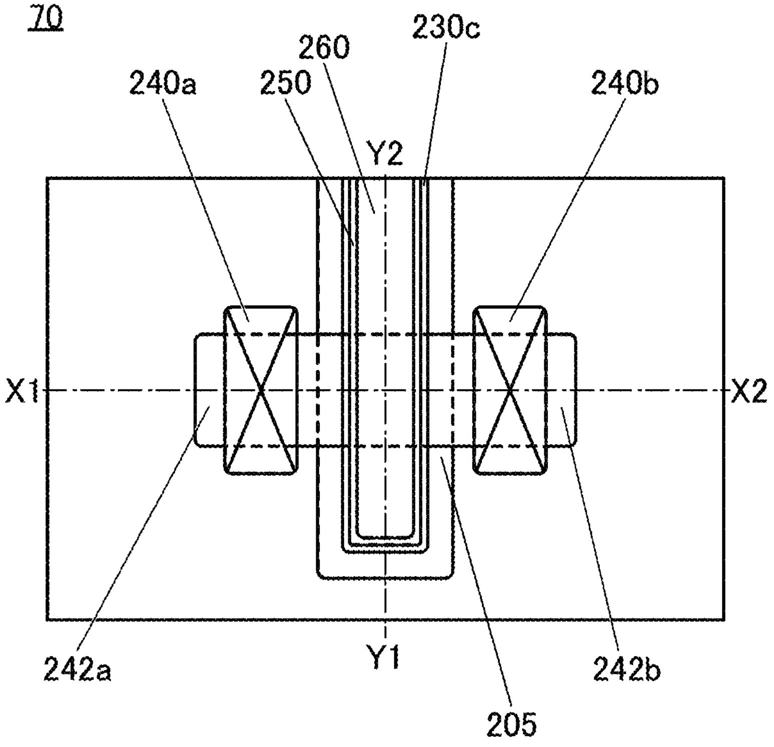
FIG. 16A is a top view illustrating a structure example of a transistor.
Figure 16C:
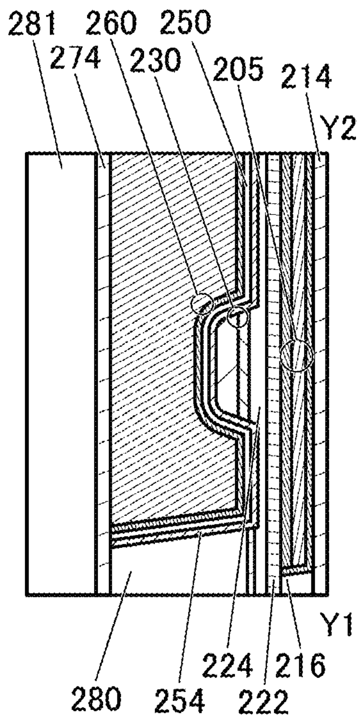
FIG. 16B and FIG. 16C are cross-sectional views illustrating the structure example of the transistor.
Figure 16B:
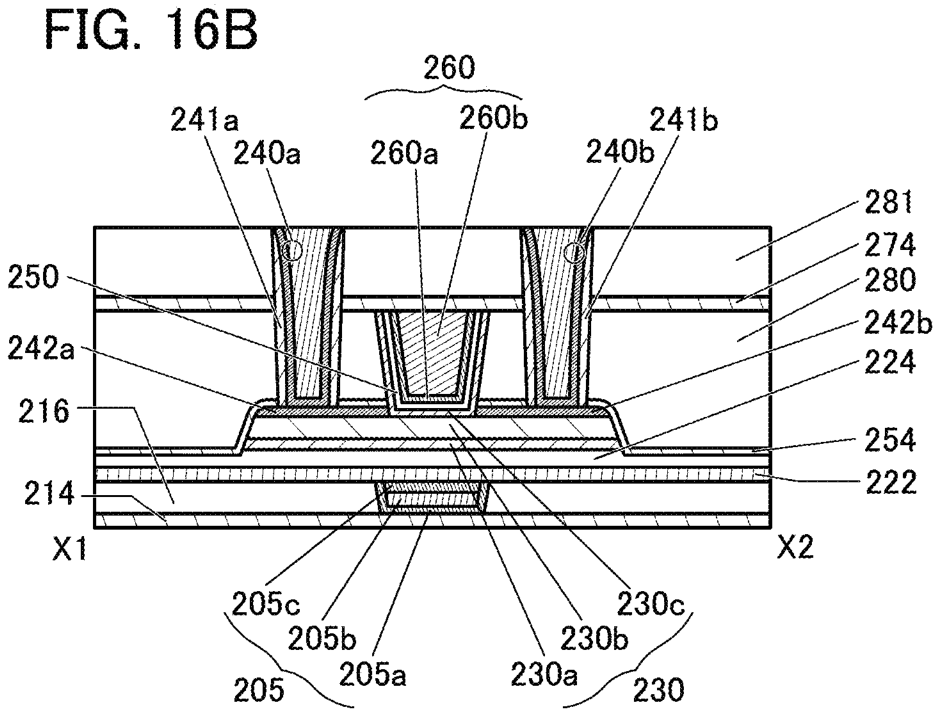

FIG. 16A, FIG. 16B, and FIG. 16C are a top view and cross-sectional views of the transistor 70 and the peripheral portion of the transistor 70.

FIG. 16A is a top view of the transistor 70. FIG. 16B and FIG. 16C are cross-sectional views of the transistor 70. Here, FIG. 16B is a cross-sectional view of a portion indicated by dashed-dotted line X1-X2 in FIG. 16A and is also a cross-sectional view of the transistor 70 in the channel length direction. FIG. 16C is a cross-sectional view of a portion indicated by a dashed-dotted line Y1-Y2 in FIG. 16A, and is also a cross-sectional view in the channel width direction of the transistor 70. Note that some components are omitted in the top view of FIG. 16A for the sake of clarity of the drawing.

As illustrated in FIG. 16A, FIG. 16B, and FIG. 16C, the transistor 70 includes a metal oxide 230*a* placed over a substrate (not illustrated); a metal oxide 230*b* placed over the metal oxide 230*a*; a conductor 242*a* and a conductor 242*b* that are placed apart from each other over the metal oxide 230*b*; the insulator 280 that is placed over the conductor 242*a* and the conductor 242*b* and has an opening between the conductor 242*a* and the conductor 242*b*; a conductor 260 placed in the opening; an insulator 250 placed between the conductor 260 and the metal oxide 230*b*, the conductor 242*a*, the conductor 242*b*, and the insulator 280; and a metal oxide 230*c* placed between the insulator 250 and the metal oxide 230*b*, the conductor 242*a*, the conductor 242*b*, and the insulator 280. Here, as illustrated in FIG. 16B and FIG. 16C, preferably, the top surface of the conductor 260 is substantially leveled with the top surfaces of the insulator 250, the insulator 254, the metal oxide 230*c*, and the insulator 280. Hereinafter, the metal oxide 230*a*, the metal oxide 230*b*, and the metal oxide 230*c* may be collectively referred to as a metal oxide 230. The conductor 242*a* and the conductor 242*b* may be collectively referred to as a conductor 242.

In the transistor 70 illustrated in FIG. 16B, side surfaces of the conductor 242*a* and the conductor 242*b* on the conductor 260 side are substantially perpendicular. Note that the transistor 70 illustrated in FIG. 16B is not limited thereto, and the angle formed between the side surfaces and the bottom surfaces of the conductor 242*a* and the conductor 242*b* may be greater than or equal to 10° and less than or equal to 80°, preferably greater than or equal to 30° and less than or equal to 60°. The side surfaces of the conductor 242*a* and the conductor 242*b* that face each other may have a plurality of surfaces.

As illustrated in FIG. 16B and FIG. 16C, the insulator 254 is preferably provided between the insulator 280 and the insulator 224, the metal oxide 230*a*, the metal oxide 230*b*, the conductor 242*a*, the conductor 242*b*, and the metal oxide 230*c*. Here, as illustrated in FIG. 16B and FIG. 16C, the insulator 254 is preferably in contact with the side surface of the metal oxide 230*c*, the top surface and the side surface of the conductor 242*a*, the top surface and the side surface of the conductor 242*b*, the side surfaces of the metal oxide 230*a* and the metal oxide 230*b*, and the top surface of the insulator 224.

In the transistor 70, three layers of the metal oxide 230*a*, the metal oxide 230*b*, and the metal oxide 230*c* are stacked in and around the region where the channel is formed (hereinafter also referred to as channel formation region); however, the present invention is not limited thereto. For example, a two-layer structure of the metal oxide 230*b* and the metal oxide 230*c* or a stacked-layer structure of four or more layers may be employed. Although the transistor 70 has a structure in which the conductor 260 has a stacked-layer structure of two layers, the present invention is not limited thereto. For example, the conductor 260 may have a single-layer structure or a stacked-layer structure of three or more layers. Furthermore, each of the metal oxide 230*a*, the metal oxide 230*b*, and the metal oxide 230*c* may have a stacked-layer structure of two or more layers.

For example, in the case where the metal oxide 230*c* has a stacked-layer structure including a first metal oxide and a second metal oxide over the first metal oxide, the first metal oxide preferably has a composition similar to that of the metal oxide 230*b* and the second metal oxide preferably has a composition similar to that of the metal oxide 230*a*.

Here, the conductor 260 functions as a gate electrode of the transistor, and the conductor 242*a* and the conductor 242*b* each function as a source electrode or a drain electrode. As described above, the conductor 260 is formed to be embedded in the opening of the insulator 280 and the region interposed between the conductor 242*a* and the conductor 242*b*. Here, the positions of the conductor 260, the conductor 242*a*, and the conductor 242*b* are selected in a self-aligned manner with respect to the opening of the insulator 280. That is, in the transistor 70, the gate electrode can be positioned between the source electrode and the drain electrode in a self-aligned manner. Thus, the conductor 260 can be formed without an alignment margin, resulting in a reduction in the area occupied by the transistor 70. Accordingly, the display device can have higher resolution. In addition, the display device can have a narrow bezel.

As illustrated in FIG. 16B and FIG. 16C, the conductor 260 preferably includes a conductor 260*a* provided on the inner side of the insulator 250 and a conductor 260*b* provided to be embedded on the inner side of the conductor 260*a*.

The transistor 70 preferably includes an insulator 214 provided over the substrate (not illustrated); an insulator 216 provided over the insulator 214; a conductor 205 provided to be embedded in the insulator 216; an insulator 222 provided over the insulator 216 and the conductor 205; and the insulator 224 provided over the insulator 222. The metal oxide 230*a* is preferably placed over the insulator 224.

The insulator 274 and the insulator 281 functioning as interlayer films are preferably placed over the transistor 70. Here, the insulator 274 is preferably provided in contact with the top surfaces of the conductor 260, the insulator 250, the insulator 254, the metal oxide 230*c*, and the insulator 280.

The insulator 222, the insulator 254, and the insulator 274 preferably have a function of inhibiting diffusion of hydrogen (e.g., at least one of a hydrogen atom, a hydrogen molecule, and the like). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom, an oxygen molecule, and the like). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 230, and the insulator 250 or excess oxygen into the insulator 224, the metal oxide 230*a*, the metal oxide 230*b*, and the insulator 250.

A conductor 240 (a conductor 240*a* and a conductor 240*b*) that is electrically connected to the transistor 70 and functions as a plug is preferably provided. Note that an insulator 241 (an insulator 241*a* and an insulator 241*b*) is provided in contact with the side surface of the conductor 240 functioning as a plug. In other words, the insulator 241 is provided in contact with the inner wall of an opening in the insulator 254, the insulator 280, the insulator 274, and the insulator 281.

In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 70 has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 70, a metal oxide functioning as an oxide semiconductor (hereinafter also referred to as an oxide semiconductor) is preferably used as the metal oxide 230 including the channel formation region (the metal oxide 230*a*, the metal oxide 230*b*, and the metal oxide 230*c*). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, the element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 16B, the metal oxide 230*b* in a region that does not overlap with the conductor 242 sometimes have smaller thickness than the metal oxide 230*b* in a region that overlaps with the conductor 242. The thin region is formed when part of the top surface of the metal oxide 230*b* is removed at the time of forming the conductor 242*a* and the conductor 242*b*. When a conductive film to be the conductor 242 is deposited, a low-resistance region is sometimes formed on the top surface of the metal oxide 230*b* in the vicinity of the interface with the conductive film. Removing the low-resistance region positioned between the conductor 242*a* and the conductor 242*b* on the top surface of the metal oxide 230*b* in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and operates at high speed can be provided. A display device that includes a transistor having stable electrical characteristics and t is highly reliable can be provided. A display device that includes a transistor with a low off-state current and has low power consumption can be provided.

The structure of the transistor 70 that can be used in the display device according to one embodiment of the present invention is described in detail.

The conductor 205 is placed to include a region overlapping with the metal oxide 230 and the conductor 260. Furthermore, the conductor 205 is preferably provided to be embedded in the insulator 216.

The conductor 205 includes the conductor 205*a*, the conductor 205*b*, and the conductor 205*c*. The conductor 205*a* is provided in contact with the bottom surface and a side wall of the opening provided in the insulator 216. The conductor 205*b* is provided to be embedded in a depressed portion formed in the conductor 205*a*. Here, the top surface of the conductor 205*b* is lower in level than the top surface of the conductor 205*a* and the top surface of the insulator 216. The conductor 205*c* is provided in contact with the top surface of the conductor 205*b* and the side surface of the conductor 205*a*. Here, the top surface of the conductor 205*c* is substantially level with the top-surface level of the conductor 205*a* and the top surface of the insulator 216. That is, the conductor 205*b* is surrounded by the conductor 205*a* and the conductor 205*c*.

Here, for the conductor 205*a* and the conductor 205*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205*a* and the conductor 205*c* are formed using a conductive material having a function of inhibiting diffusion of hydrogen, impurities such as hydrogen contained in the conductor 205*b* can be inhibited from diffusing into the metal oxide 230 through the insulator 224 or the like. When the conductor 205*a* and the conductor 205*c* are formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 205*a* may be a single layer or a stacked layer of the above conductive materials. For example, titanium nitride may be used for the conductor 205*a*.

A conductive material containing tungsten, copper, or aluminum as its main component is preferably used for the conductor 205*b*. For example, tungsten is preferably used for the conductor 205*b*.

The conductor 260 sometimes functions as a first gate (also referred to as top gate) electrode. The conductor 205 sometimes functions as a second gate (also referred to as bottom gate) electrode. In that case, Vth of the transistor 70 can be controlled by changing a potential applied to the conductor 205 independently of a potential applied to the conductor 260. In particular, by applying a negative potential to the conductor 205, Vth of the transistor 70 can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 16C. In other words, the conductor 205 and the conductor 260 preferably overlap each other with the insulator placed therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 16C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 70 from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$, or the like), or a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide, silicon nitride, or the like is preferably used for the insulator 214. Accordingly, it is possible to inhibit diffusion of impurities such as water or hydrogen to the transistor 70 side from the substrate side through the insulator 214. It is also possible to inhibit diffusion of oxygen contained in the insulator 224 and the like toward the substrate through the insulator 214.

The permittivity of each of the insulator 216, the insulator 280, and the insulator 281 functioning as an interlayer film is preferably lower than that of the insulator 214. When a material with a low permittivity is used for the interlayer film, parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 70.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably in the range of 100° C. to 700° C., inclusive, or 100° C. to 400° C., inclusive.

As illustrated in FIG. 16C, the insulator 224 is sometimes thinner in a region that overlaps with neither the insulator 254 nor the metal oxide 230*b* than in the other regions. In the insulator 224, the thickness of the region that overlaps with neither the insulator 254 nor the metal oxide 230*b* is preferably small enough for the above oxygen to be adequately diffused.

Like the insulator 214 and the like, the insulator 222 preferably functions as a barrier insulating film that inhibits the entry of impurities such as water or hydrogen into the transistor 70 from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 70 from outside can be inhibited.

Furthermore, the insulator 222 preferably has a function of inhibiting diffusion of oxygen (e.g., at least one of an oxygen atom, an oxygen molecule, and the like) (it is preferable that oxygen be less likely to pass through the insulator 222). For example, the insulator 222 preferably has a lower oxygen permeability than the insulator 224. The insulator 222 preferably has a function of inhibiting diffusion of oxygen or impurities, in which case oxygen contained in the metal oxide 230 is less likely to diffuse to the substrate side. The insulator 222 can also inhibit the conductor 205 from reacting with oxygen contained in the insulator 224 or oxygen contained in the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer inhibiting oxygen release from the metal oxide 230 and entry of impurities such as hydrogen into the metal oxide 230 from the periphery of the transistor 70.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

The insulator 222 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or (Ba,Sr)$TiO_3$ (BST). As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness of the gate insulator is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230*a*, the metal oxide 230*b* over the metal oxide 230*a*, and the metal oxide 230*c* over the metal oxide 230*b*. When the metal oxide 230 includes the metal oxide 230*a* under the metal oxide 230*b*, it is possible to inhibit diffusion of impurities into the metal oxide 230*b* from the components formed below the metal oxide 230*a*. Moreover, when the metal oxide 230 includes the metal oxide 230*c* over the metal oxide 230*b*, it is possible to inhibit diffusion of impurities into the metal oxide 230*b* from the components formed above the metal oxide 230*c*.

Note that the metal oxide 230 preferably has a stacked-layer structure of a plurality of oxide layers that differ in the atomic ratio of metal atoms. For example, in the case where the metal oxide 230 contains at least indium (In) and the element M, the proportion of the number of atoms of the element M contained in the metal oxide 230*a* to the number of atoms of all elements that constitute the metal oxide 230*a* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*a* is preferably higher than the atomic ratio of the element M to In in the metal oxide 230*b*. Here, a metal oxide that can be used as the metal oxide 230*a* or the metal oxide 230*b* can be used as the metal oxide 230*c*.

The energy of the conduction band minimum of each of the metal oxide 230*a* and the metal oxide 230*c* is preferably higher than the energy of the conduction band minimum of the metal oxide 230*b*. In other words, the electron affinity of each of the metal oxide 230*a* and the metal oxide 230*c* is preferably smaller than the electron affinity of the metal oxide 230*b*. In this case, a metal oxide that can be used as the metal oxide 230*a* is preferably used as the metal oxide 230*c*. Specifically, the proportion of the number of atoms of the element M contained in the metal oxide 230*c* to the number of atoms of all elements that constitute the metal oxide 230*c* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*c* is preferably higher than the atomic ratio of the element M to In in the metal oxide 230*b*.

Here, the energy level of the conduction band minimum gently changes at junction portions between the metal oxide 230*a*, the metal oxide 230*b*, and the metal oxide 230*c*. In other words, the energy levels of the conduction band minimum at junction portions between the metal oxide 230*a*, the metal oxide 230*b*, and the metal oxide 230*c* continuously vary or are continuously connected. This can be achieved by decreasing the density of defect states in a mixed layer formed at the interface between the metal oxide 230*a* and the metal oxide 230*b* and the interface between the metal oxide 230*b* and the metal oxide 230*c*.

Specifically, when the metal oxide 230*a* and the metal oxide 230*b* or the metal oxide 230*b* and the metal oxide 230*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230*a* and the metal oxide 230*c*, in the case where the metal oxide 230*b* is an In—Ga—Zn oxide. The metal oxide 230*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230*c* may have a stacked-layer structure of an In—Ga—Zn oxide and an oxide that does not contain In.

Specifically, as the metal oxide 230*a*, a metal oxide with In:Ga:Zn=1:3:4 [atomic ratio] or 1:1:0.5 [atomic ratio] may be used. Moreover, as the metal oxide 230*b*, a metal oxide with In:Ga:Zn=4:2:3 [atomic ratio] or 3:1:2 [atomic ratio] may be used. As the metal oxide 230*c*, a metal oxide with an atomic ratio of In:Ga:Zn=1:3:4 [atomic ratio], In:Ga:Zn=4:2:3 [atomic ratio], Ga:Zn=2:1 [atomic ratio], or Ga:Zn=2:5 [atomic ratio] may be used. Specific examples of a stacked-layer structure of the metal oxide 230*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230*b* serves as a main carrier path. When the metal oxide 230*a* and the metal oxide 230*c* have the above structure, the density of defect states at the interface between the metal oxide 230*a* and the metal oxide 230*b* and the interface between the metal oxide 230*b* and the metal oxide 230*c* can be made low. This reduces the influence of interface scattering on carrier conduction, and the transistor 70 can have a high on-state current and high frequency characteristics. Note that in the case where the metal oxide 230*c* has a stacked-layer structure, not only the effect of reducing the density of defect states at the interface between the metal oxide 230*b* and the metal oxide 230*c*, but also the effect of inhibiting diffusion of the constituent element contained in the metal oxide 230*c* to the insulator 250 side can be expected. Specifically, the metal oxide 230*c* has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230*c* having a stacked-layer structure allows a highly reliable display device to be provided.

The conductor 242 (the conductor 242*a* and the conductor 242*b*) functioning as the source electrode and the drain electrode is provided over the metal oxide 230*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242*a* and the conductor 242*b* is formed to overlap with the opening of the insulator 280. Accordingly, the conductor 260 can be formed in a self-aligned manner between the conductor 242*a* and the conductor 242*b*.

The insulator 250 functions as a gate insulator. The insulator 250 is preferably placed in contact with the top surface of the metal oxide 230*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds of hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIG. 16B and FIG. 16C, a single-layer structure or a stacked-layer structure of three or more layers may be employed.

The conductor 260*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260*a* has a function of inhibiting diffusion of oxygen, it is possible to inhibit reduction of the conductivity due to oxidation of the conductor 260*b* by oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of titanium or titanium nitride and the above conductive material.

As illustrated in FIG. 16A and FIG. 16C, the side surface of the metal oxide 230 is covered with the conductor 260 in a region where the metal oxide 230*b* does not overlap with the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 70 can be increased and the frequency characteristics of the transistor 70 can be improved.

The insulator 254, like the insulator 214 and the like, preferably functions as a barrier insulating film that inhibits the entry of impurities such as water or hydrogen into the transistor 70 from the insulator 280 side. The insulator 254 preferably has lower hydrogen permeability than the insulator 224, for example. Furthermore, as illustrated in FIG. 16B and FIG. 16C, the insulator 254 is preferably in contact with the side surface of the metal oxide 230*c*, the top and side surfaces of the conductor 242*a*, the top and side surfaces of the conductor 242*b*, side surfaces of the metal oxide 230*a* and the metal oxide 230*b*, and the top surface of the insulator 224. Such a structure can inhibit the entry of hydrogen contained in the insulator 280 into the metal oxide 230 through the top surfaces or side surfaces of the conductor 242*a*, the conductor 242*b*, the metal oxide 230*a*, the metal oxide 230*b*, and the insulator 224.

Furthermore, the insulator 254 preferably has a function of inhibiting diffusion of oxygen (e.g., at least one of an oxygen atom, an oxygen molecule, and the like) (it is preferable that oxygen be less likely to pass through the insulator 254). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be inhibited from having normally-on characteristics.

As the insulator 254, an insulator containing an oxide of one or both of aluminum and hafnium is preferably deposited, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit entry of impurities such as hydrogen from the outside of the transistor 70, resulting in favorable electrical characteristics and high reliability of the transistor 70.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, or the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240*a* and the conductor 240*b* are placed in openings formed in the insulator 281, the insulator 274, the insulator 280, and the insulator 254. The conductor 240*a* and the conductor 240*b* are placed to face each other with the conductor 260 therebetween. Note that the top surfaces of the conductor 240*a* and the conductor 240*b* may be on the same plane as the top surface of the insulator 281.

The insulator 241*a* is provided in contact with the inner walls of the openings in the insulator 281, the insulator 274, the insulator 280, and the insulator 254, and the first conductor of the conductor 240*a* is formed in contact with the side surface of the insulator 241*a*. The conductor 242*a* is positioned in at least part of the bottom portion of the opening, and the conductor 240*a* is in contact with the conductor 242*a*. Similarly, the insulator 241*b* is provided in contact with the inner walls of the openings in the insulator 281, the insulator 274, the insulator 280, and the insulator 254, and the first conductor of the conductor 240*b* is formed in contact with the side surface of the insulator 241*b*. The conductor 242*b* is positioned in at least part of the bottom portion of the opening, and the conductor 240*b* is in contact with the conductor 242*b*.

The conductor 240*a* and the conductor 240*b* are preferably formed using a conductive material containing tungsten, copper, or aluminum as the main component. The conductor 240*a* and the conductor 240*b* may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230*a*, the metal oxide 230*b*, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 280 from being absorbed by the conductor 240*a* and the conductor 240*b*. Moreover, impurities such as water or hydrogen can be inhibited from entering the metal oxide 230 through the conductor 240*a* and the conductor 240*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 254, impurities such as water or hydrogen can be inhibited from entering the metal oxide 230 from the insulator 280 or the like through the conductor 240*a* and the conductor 240*b*. Furthermore, oxygen contained in the insulator 280 can be inhibited from being absorbed by the conductor 240*a* and the conductor 240*b*.

Although not illustrated, a conductor functioning as a wiring may be placed in contact with the top surface of the conductor 240*a* and the top surface of the conductor 240*b*. For the conductor functioning as a wiring, a conductive material containing tungsten, copper, or aluminum as its main component is preferably used. Furthermore, the conductor may have a stacked-layer structure and may be stacked layers of the above conductive material and titanium or titanium nitride, for example. Note that the conductor may be formed to be embedded in an opening provided in an insulator.

Structure Example of Light-Emitting Element

Figure 17A:
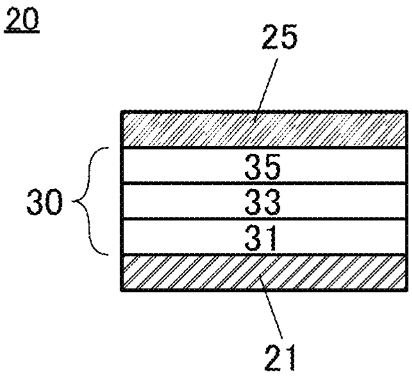
FIG. 17A to FIG. 17C are cross-sectional views illustrating structure examples of a light-emitting element.

As described above, the EL layer 30 included in the light-emitting element 20 can be formed of a plurality of layers such as the hole-injection layer 31, the light-emitting layer 33, and the electron-injection layer 35, as illustrated in FIG. 17A.

The structure in which the hole-injection layer 31, the light-emitting layer 33, and the electron-injection layer 35 are provided between the lower electrode 21 and the upper electrode 25 can serve as a single light-emitting unit, and the structure in FIG. 17A is referred to as a single structure in this specification.

Figure 17B:
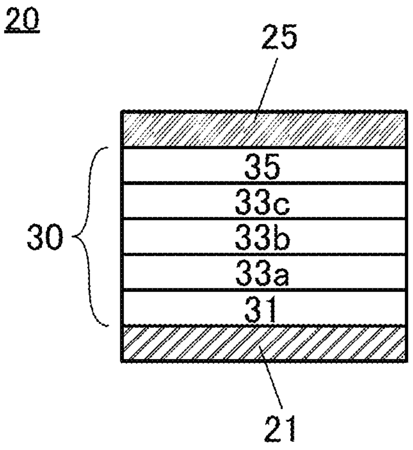

Note that the structure in which a plurality of light-emitting layers (e.g., a light-emitting layer 33*a*, a light-emitting layer 33*b*, and a light-emitting layer 33*c*) are provided between the electron-injection layer 35 and the hole-injection layer 31 as illustrated in FIG. 17B is a variation of the single structure.

Figure 17C:
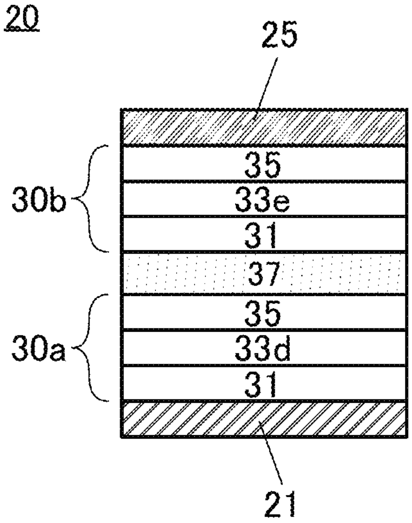

The structure in which a plurality of light-emitting units (e.g., an EL layer 30*a* and an EL layer 30*b*) are connected in series with an intermediate layer (charge-generation layer) 37 therebetween as illustrated in FIG. 17C is referred to as a tandem structure in this specification. FIG. 17C illustrates a structure in which the EL layer 30*a* includes a light-emitting layer 33*d* and the EL layer 30*b* includes a light-emitting layer 33*e*. In this specification and the like, the structure illustrated in FIG. 17C is referred to as a tandem structure; however, without being limited to this, a tandem structure may be referred to as a stack structure, for example. The tandem structure enables a light-emitting element capable of high luminance light emission.

In the case where the single structure, the tandem structure, and the SBS structure described above are compared with each other, the SBS structure, the tandem structure, and the single structure can have lower power consumption in this order. To reduce power consumption of the display device of one embodiment of the present invention, the SBS structure is preferably employed. Meanwhile, the manufacturing processes of the single structure and the tandem structure are simpler than that of the SBS structure. This can achieve low manufacturing cost and high yield of the display device of one embodiment of the present invention. Accordingly, the display device of one embodiment of the present invention can be provided at lower cost.

The emission color of the light-emitting element 20 can be red, green, blue, cyan, magenta, yellow, white, or the like depending on the material that constitutes the EL layer 30. Furthermore, the color purity can be further increased when the light-emitting element 20 has a microcavity structure.

The light-emitting element that emits white light preferably contains two or more kinds of light-emitting substances in the light-emitting layer. To obtain white light emission, two or more kinds of light-emitting substances can be selected such that their emission colors are complementary.

The light-emitting layer preferably contains two or more kinds of light-emitting substances that emit light of R (red), G (green), B (blue), Y (yellow), O (orange), or the like.

For example, in the case where the light-emitting layer 33*a* has a function of emitting red light, the light-emitting layer 33*b* has a function of emitting green light, and the light-emitting layer 33*c* has a function of emitting blue light, the light-emitting element 20 illustrated in FIG. 17B can emit white light. In the case where the light-emitting layer 33*d* has a function of emitting yellow light and the light-emitting layer 33*e* has a function of emitting blue light, the light-emitting element 20 illustrated in FIG. 17C can emit white light.

At least part of this embodiment can be implemented in combination with the other embodiments described in this specification as appropriate.

Embodiment 2

Described in this embodiment is a metal oxide that can be used in the OS transistor described in the above embodiment.

<Classification of Crystal Structures>

First, the classification of the crystal structures of an oxide semiconductor is described with reference to FIG. 18A. FIG. 18A is a diagram showing the classification of the crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). The term "Crystal" includes single crystal and poly crystal.

Note that the structures in the thick frame shown in FIG. 18A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 18B shows an XRD spectrum, which is obtained by GIXD (Grazing-Incidence XRD) measurement, of a CAAC-IGZO film classified into "Crystalline". In FIG. 18B, the horizontal axis represents 2θ [deg.], and the vertical axis represents Intensity [a.u.]. Note that a GIXD method is also referred to as a thin film method or a Seemann-Bohlin method. The XRD spectrum that is shown in FIG. 18B and obtained by GIXD measurement is hereinafter simply referred to as an XRD spectrum. The CAAC-IGZO film in FIG. 18B has a composition in the vicinity of In:Ga:Zn=4:2:3 [atomic ratio]. The CAAC-IGZO film in FIG. 18B has a thickness of 500 nm.

In FIG. 18B, the horizontal axis represents 2θ [deg.], and the vertical axis represents intensity [a.u.]. As shown in FIG. 18B, a clear peak indicating crystallinity is observed in the XRD spectrum of the CAAC-IGZO film. Specifically, a peak indicating c-axis alignment is observed at 2θ of at or around 31° in the XRD spectrum of the CAAC-IGZO film. As shown in FIG. 18B, the peak at 2θ of at or around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 18C shows a diffraction pattern of the CAAC-IGZO film. FIG. 18C shows a diffraction pattern obtained by the NBED method in which an electron beam is incident in the direction parallel to the substrate. The CAAC-IGZO film in FIG. 18C has a composition of In:Ga:Zn=4:2:3 [atomic ratio] or in the vicinity thereof. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

[Structure of Oxide Semiconductor]

Oxide semiconductors may be classified in a manner different from the one in FIG. 18A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal elements are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$ and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in an adjacent film is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by Secondary Ion Mass Spectrometry (SIMS) are each set lower than or equal to $2\times10^{18}$ $atoms/cm^3$, preferably lower than or equal to $2\times10^{17}$ $atoms/cm^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

An oxide semiconductor containing nitrogen easily becomes n-type by generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for a channel formation region in a transistor, stable electrical characteristics can be given.

At least part of this embodiment can be implemented in combination with any of the other embodiments described in this specification as appropriate.

Embodiment 3

In this embodiment, electronic devices each including a display device of one embodiment of the present invention are described.

Figure 19A:
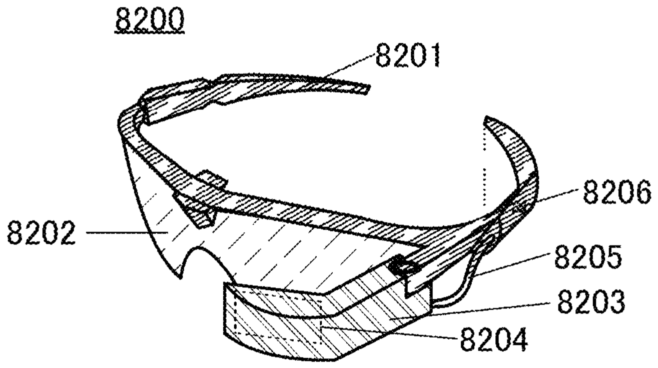
FIG. 19A to FIG. 19D are diagrams showing examples of electronic devices.

FIG. 19A is a diagram illustrating the appearance of a head-mounted display 8200.

The head-mounted display 8200 includes a mount part 8201, a lens 8202, a main body 8203, a display portion 8204, a cable 8205, and the like. A battery 8206 is incorporated in the mount part 8201.

The cable 8205 supplies electric power from the battery 8206 to the main body 8203. The main body 8203 includes a wireless receiver or the like, and can display an image corresponding to the received image data or the like on the display portion 8204. The movement of the eyeball or the eyelid of the user is captured by a camera provided in the main body 8203 and then coordinates of the sight line of the user are calculated using the information to utilize the sight line of the user as an input means.

A plurality of electrodes may be provided in the mount part 8201 at a position to be in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mount part 8201 may include various kinds of sensors such as a temperature sensor, a pressure sensor, or an acceleration sensor to have a function of displaying the user's biological information on the display portion 8204. The main body 8203 may sense the movement or the like of the user's head to change an image displayed on the display portion 8204 in synchronization with the movement.

The display device of one embodiment of the present invention can be used for the display portion 8204. Thus, a high-quality image can be displayed on the display portion 8204.

Figure 19B:
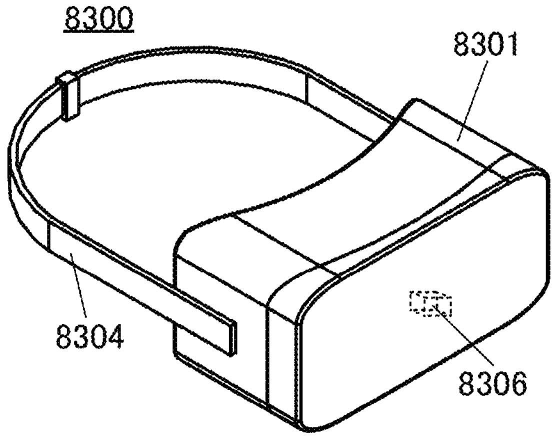
Figure 19C:
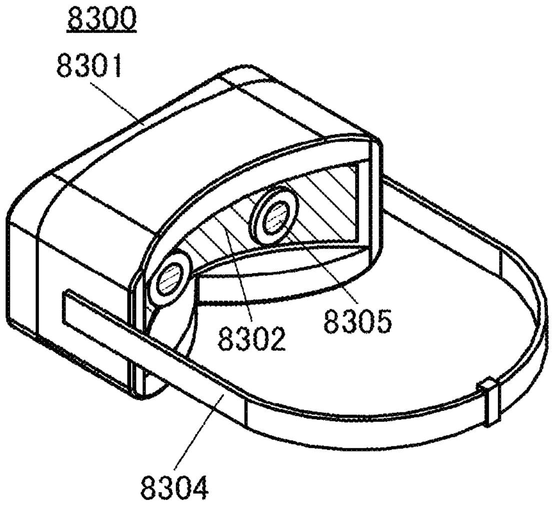
Figure 19D:
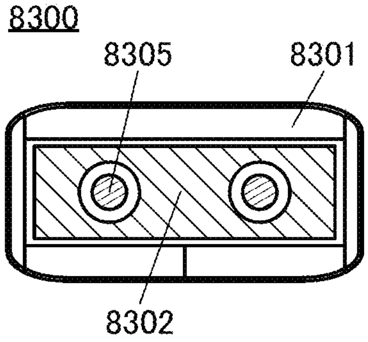

FIG. 19B, FIG. 19C, and FIG. 19D are diagrams illustrating the appearance of a head-mounted display 8300. The head-mounted display 8300 includes a housing 8301, a display portion 8302, a band-shaped fixing unit 8304, and a pair of lenses 8305. A battery 8306 is incorporated in the housing 8301, and electric power can be supplied from the battery 8306 to the display portion 8302 or the like.

The user can see display on the display portion 8302 through the lenses 8305. It is preferable that the display portion 8302 be curved and placed. When the display portion 8302 is curved and placed, the user can feel a high realistic sensation. Note that although the structure in which one display portion 8302 is provided is described as an example in this embodiment, the structure is not limited thereto, and a structure in which two display portions 8302 are provided may also be employed. In that case, one display portion is placed for one eye of the user and the other display portion is placed for the other eye, so that three-dimensional display using parallax or the like is possible.

Note that the display device of one embodiment of the present invention can be used for the display portion 8302. Thus, a high-quality image can be displayed on the display portion 8302.

Figure 20A:
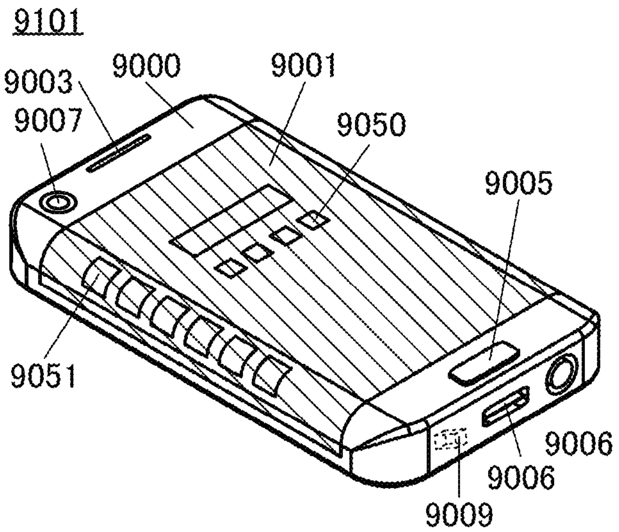
FIG. 20A and FIG. 20B are diagrams showing examples of electronic devices.
Figure 20B:
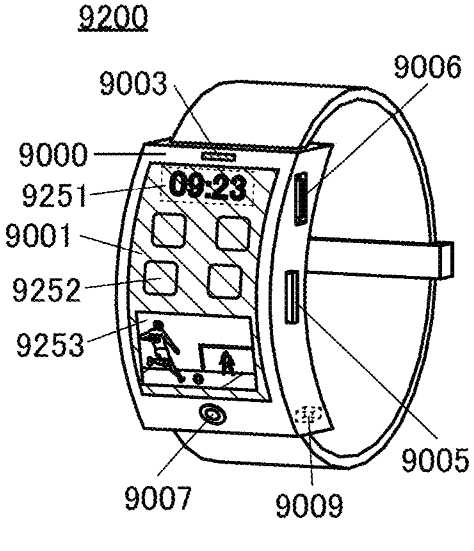

Next, FIG. 20A and FIG. 20B illustrate examples of electronic devices that are different from the electronic devices illustrated in FIG. 19A to FIG. 19D.

Electronic devices illustrated in FIG. 20A and FIG. 20B include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a battery 9009, and the like.

The electronic devices illustrated in FIG. 20A and FIG. 20B have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 20A and FIG. 20B are not limited thereto, and the electronic devices can have a variety of functions. Although not illustrated in FIG. 20A or FIG. 20B, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, and the like.

The details of the electronic devices illustrated in FIG. 20A and FIG. 20B are described below.

FIG. 20A is a perspective view illustrating a portable information terminal 9101. The portable information terminal 9101 has one or more functions selected from a telephone set, a notebook, an information browsing device, and the like, for example. Specifically, the portable information terminal 9101 can be used as a smartphone. The portable information terminal 9101 can display characters or an image on its plurality of surfaces. For example, an operation button 9050 (also referred to as an operation icon, or simply an icon) can be displayed on one surface of the display portion 9001. Information 9051 represented by a dotted line rectangle can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and the radio field intensity. Alternatively, the operation buttons 9050 or the like may be displayed on the position where the information 9051 is displayed, in place of the information 9051.

The display device of one embodiment of the present invention can be used for the portable information terminal 9101. Thus, a high-quality image can be displayed on the display portion 9001.

FIG. 20B is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved, and display is performed on the curved display surface. FIG. 20B illustrates an example in which time 9251, operation buttons 9252 (also referred to as operation icons or simply icons), and a content 9253 are displayed on the display portion 9001. The content 9253 can be a moving image, for example.

The portable information terminal 9200 can perform near field communication conformable to a communication standard. For example, mutual communication between the portable information terminal 9200 and a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used for the portable information terminal 9200. Thus, a high-quality image can be displayed on the display portion 9001.

At least part of this embodiment can be implemented in combination with any of the other embodiments described in this specification as appropriate.

REFERENCE NUMERALS

10: display device, 11: transistor, 13: insulating layer, 15: conductive layer, 17: conductive layer, 19: partition, 20: light-emitting element, 20B: light-emitting element, 20G: light-emitting element, 20R: light-emitting element, 21: lower electrode, 21A: layer, 25: upper electrode, 30: EL layer, 30*a*: EL layer, 30*b*: EL layer, 31: hole-injection layer, 31A: layer, 31B: layer, 31C: layer, 33: light-emitting layer, 33*a*: light-emitting layer, 33A: layer, 33*b*: light-emitting layer, 33B: light-emitting layer, 33BA: layer, 33*c*: light-emitting layer, 33*d*: light-emitting layer, 33*e*: light-emitting layer, 33G: light-emitting layer, 33GA: layer, 33R: light-emitting layer, 33RA: layer, 35: electron-injection layer, 35A: layer, 40: gap, 43: protective layer, 45: microlens array, 47: adhesive layer, 49: light-blocking layer, 51: insulating layer, 53: substrate, 55: coloring layer, 55B: coloring layer, 55G: coloring layer, 55R: coloring layer, 60: pixel, 60B: pixel, 60G: pixel, 60R: pixel, 61: light, 63: region, 67: conductive layer, 69: conductive layer, 70: transistor, 71: insulating layer, 80: transistor, 81: substrate, 82: conductive layer, 83: insulating layer, 85*a*: low-resistance region, 85*b*: low-resistance region, 86: element isolation layer, 87: semiconductor layer, 88: insulating layer, 91: sealant, 93: connection electrode, 95: anisotropic conductive layer, 97: FPC, 100: display portion, 101: scan line driver circuit, 103: data line driver circuit, 105: wiring, 107: wiring, 110: pixel circuit, 111: transistor, 113: transistor, 115: capacitor, 117: node, 119: node, 121: layer, 123: layer, 125: layer, 131: insulating layer, 133: insulating layer, 135: insulating layer, 137: insulating layer, 140: sacrifice layer, 140A: layer, 140B: layer, 140C: layer, 205: conductor, 205*a*: conductor, 205*b*: conductor, 205*c*: conductor, 214: insulator, 216: insulator, 222: insulator, 224: insulator, 230: metal oxide, 230*a*: metal oxide, 230*b*: metal oxide, 230*c*: metal oxide, 240: conductor, 240*a*: conductor, 240*b*: conductor, 241: insulator, 241*a*: insulator, 241*b*: insulator, 242: conductor, 242*a*: conductor, 242*b*: conductor, 250: insulator, 254: insulator, 260: conductor, 260*a*: conductor, 260*b*: conductor, 274: insulator, 280: insulator, 281: insulator, 8200: head-mounted display, 8201: mount part, 8202: lens, 8203: main body, 8204: display portion, 8205: cable, 8206: battery, 8300: head-mounted display, 8301: housing, 8302: display portion, 8304: fixing unit, 8305: lens, 8306: battery, 9000: housing, 9001: display portion, 9003: speaker, 9005: operation key, 9006: connection terminal, 9007: sensor, 9009: battery, 9050: operation button, 9051: information, 9101: portable information terminal, 9200: portable information terminal, 9251: time, 9252: operation button, 9253: content This application is based on Japanese Patent Application Serial No. 2021-001852 filed on Jan. 8, 2021, the entire contents are hereby incorporated herein by reference.

The invention claimed is:

1. A display device comprising a first light-emitting element; a second light-emitting element; and a gap, wherein the first light-emitting element comprises a first light-emitting layer and a first electron-injection layer over the first light-emitting layer, wherein the second light-emitting element comprises a second light-emitting layer and a second electron-injection layer over the second light-emitting layer, wherein the first light-emitting element is adjacent to the second light-emitting element, wherein the gap is placed between the first electron-injection layer and first light-emitting layer and the second electron-injection layer and second light-emitting layer, wherein the first light-emitting layer is in contact with a first side surface of the gap, wherein the second light-emitting layer is in contact with a second side surface of the gap, wherein the first electron-injection layer comprises a region projecting from a side surface of the first light-emitting layer, and wherein the second electron-injection layer comprises a region projecting from a side surface of the second light-emitting layer.

2. The display device according to claim 1, comprising a region in which a distance between a side surface of the first electron-injection layer and a side surface of the second electron-injection layer is less than or equal to 1 μm.

3. The display device according to claim 2, comprising a region in which the distance between the side surface of the first electron-injection layer and the side surface of the second electron-injection layer is less than or equal to 100 nm.

4. The display device according to claim 1, wherein the gap comprises a gas containing one or more of nitrogen, oxygen, carbon dioxide, and a Group 18 element.

5. The display device according to claim 4, wherein the Group 18 element includes one or more of helium, neon, argon, xenon, and krypton.

6. The display device according to claim 1, wherein a refractive index of the first light-emitting layer and a refractive index of the second light-emitting layer are higher than a refractive index of the gap.

7. The display device according to claim 1, wherein the first electron-injection layer and the second electron-injection layer comprise silver and a compound having at least one of a pyridine ring, a diazine ring (a pyrimidine ring, a pyrazine ring, or a pyridazine ring), and a triazine ring.

8. The display device according to claim 7, wherein the first electron-injection layer and the second electron-injection layer comprise NBPhen and silver.

9. The display device according to claim 1, wherein the first light-emitting element and the second light-emitting element are provided over an insulating layer, wherein a top surface of the insulating layer comprises a region in contact with a bottom surface of the gap, and wherein a thickness of the insulating layer in the region in which the top surface of the insulating layer is in contact with the bottom surface of the gap is smaller than a thickness of the insulating layer in a region overlapping with the first light-emitting layer and a thickness of the insulating layer in a region overlapping with the second light-emitting layer.

10. The display device according to claim 1, wherein the display device comprises a first transistor and a second transistor, wherein the first light-emitting element comprises a first electrode under the first light-emitting layer, wherein the second light-emitting element comprises a second electrode under the second light-emitting layer, wherein one of a source and a drain of the first transistor is electrically connected to the first electrode, wherein one of a source and a drain of the second transistor is electrically connected to the second electrode, and wherein each of the first transistor and the second transistor comprises silicon in a channel formation region.

11. The display device according to claim 1, wherein the display device comprises a first transistor and a second transistor, wherein the first light-emitting element comprises a first electrode under the first light-emitting layer, wherein the second light-emitting element comprises a second electrode under the second light-emitting layer, wherein one of a source and a drain of the first transistor is electrically connected to the first electrode, wherein one of a source and a drain of the second transistor is electrically connected to the second electrode, and wherein each of the first transistor and the second transistor comprises a metal oxide in a channel formation region.

12. An electronic device comprising the display device according to claim 1 and a lens.

13. The display device according to claim 1, wherein the first electron-injection layer overlaps with the gap, and wherein the second electron-injection layer overlaps with the gap.

14. A method for manufacturing a display device, comprising:

depositing a layer to be a first light-emitting layer and a layer to be a first sacrifice layer and processing the layers by first etching to form the first light-emitting layer and the first sacrifice layer;

depositing a layer to be a second light-emitting layer and a layer to be a second sacrifice layer and processing the layers by second etching to form the second light-emitting layer and the second sacrifice layer;

removing the first sacrifice layer and the second sacrifice layer;

depositing layer to be a first electron-injection layer and a second electron-injection layer and processing the layers by third etching to form the first electron-injection layer and the second electron-injection layer; and processing the first light-emitting layer and the second light-emitting layer by fourth etching so that the first electron-injection layer includes a region projecting a side surface of the first light-emitting layer and the second electron-injection layer includes a region projecting from a side surface of the second light-emitting layer.

15. The method for manufacturing the display device according to claim 14, wherein isotropy of the fourth etching is higher than isotropy of the first to the third etching.

16. The method for manufacturing the display device according to claim 14, wherein the first light-emitting layer and the second light-emitting layer are configured to emit light of different colors.

17. A display device comprising a first light-emitting element; a second light-emitting element; and a gap, wherein the first light-emitting element comprises a first light-emitting layer and a first electron-injection layer over the first light-emitting layer, wherein the second light-emitting element comprises a second light-emitting layer and a second electron-injection layer over the second light-emitting layer, wherein the first light-emitting element is adjacent to the second light-emitting element, wherein the gap is placed between the first electron-injection layer and first light-emitting layer and the second electron-injection layer and second light-emitting layer, wherein the first light-emitting layer is in contact with a first side surface of the gap, wherein the second light-emitting layer is in contact with a second side surface of the gap, wherein the first electron-injection layer is in contact with the first side surface of the gap, wherein the second electron-injection layer is in contact with the second side surface of the gap, wherein the first electron-injection layer comprises a region projecting from a side surface of the first light-emitting layer, and wherein the second electron-injection layer comprises a region projecting from a side surface of the second light-emitting layer.

18. The display device according to claim 17, comprising a region in which a distance between a side surface of the first electron-injection layer and a side surface of the second electron-injection layer is less than or equal to 1 μm.

19. The display device according to claim 18, comprising a region in which the distance between the side surface of the first electron-injection layer and the side surface of the second electron-injection layer is less than or equal to 100 nm.

20. The display device according to claim 17, wherein the gap comprises a gas containing one or more of nitrogen, oxygen, carbon dioxide, and a Group 18 element.

21. The display device according to claim 20, wherein the Group 18 element includes one or more of helium, neon, argon, xenon, and krypton.

22. The display device according to claim 17, wherein the first electron-injection layer overlaps with the gap, and wherein the second electron-injection layer overlaps with the gap.

* * * * *